(12) United States Patent
Saitoh et al.

(10) Patent No.: US 7,335,581 B2
(45) Date of Patent: Feb. 26, 2008

(54) SEMICONDUCTOR MEMORY DEVICE AND METHOD OF MANUFACTURING THE SAME

(75) Inventors: Masahiro Saitoh, Fukuyama (JP); Masahiko Yanagi, Kasaoka (JP); Toshiyuki Tohda, Higashi Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 120 days.

(21) Appl. No.: 11/396,921

(22) Filed: Apr. 4, 2006

(65) Prior Publication Data

US 2006/0223256 A1    Oct. 5, 2006

(30) Foreign Application Priority Data

Apr. 4, 2005    (JP)    ............................. 2005-107328

(51) Int. Cl.
*H01L 21/3205*    (2006.01)
(52) U.S. Cl. .................. 438/595; 438/197; 438/259; 438/301; 257/E21.18
(58) Field of Classification Search ................ 438/280; 257/E21.176, E21.177, E21.18, E21.19
See application file for complete search history.

(56) References Cited

U.S. PATENT DOCUMENTS 6,842,370 B2 *    1/2005    Forbes ........................ 365/177
7,195,995 B2 *    3/2007    Mouli ......................... 438/529

FOREIGN PATENT DOCUMENTS

JP    2004-186663 A    7/2004
WO    99/07000 A2    2/1999

* cited by examiner

*Primary Examiner*—Michael Lebentritt
*Assistant Examiner*—Cheung Lee
(74) *Attorney, Agent, or Firm*—Nixon & Vanderhye, P.C.

(57) ABSTRACT

A method of manufacturing a semiconductor memory device includes the steps of providing a gate insulating film on an active region, depositing a first conductive film on the gate insulating film, processing the first conductive film, the gate insulating film, and the active region to provide an opening of which the bottom is located below the interface between the active region and the gate insulating film and then providing a gate electrode between the openings, depositing a first insulating film which covers the side and bottom surface of the opening, depositing a second insulating film over the first insulating film, shaping the first and second insulating films into a side wall spacer shape by etching to provide charge retention sections beside the gate electrode and providing diffusion areas at opposite sides of the gate electrode beneath the charge retention sections in the active region.

8 Claims, 32 Drawing Sheets

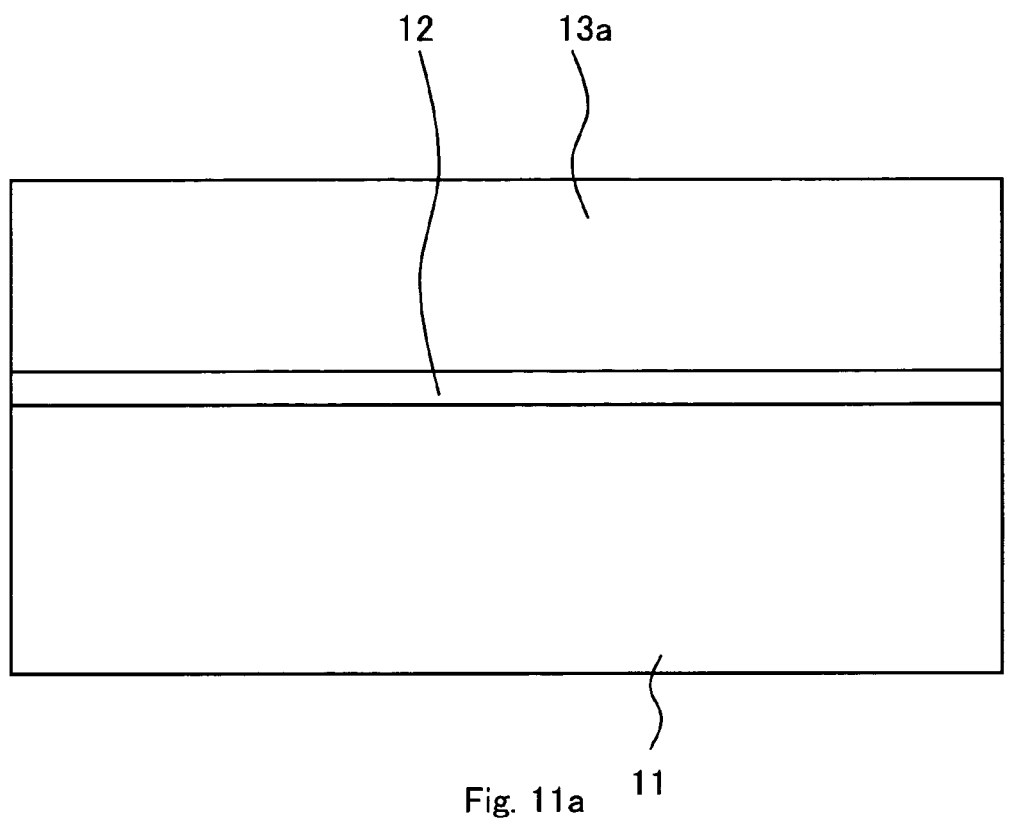
Fig. 11a
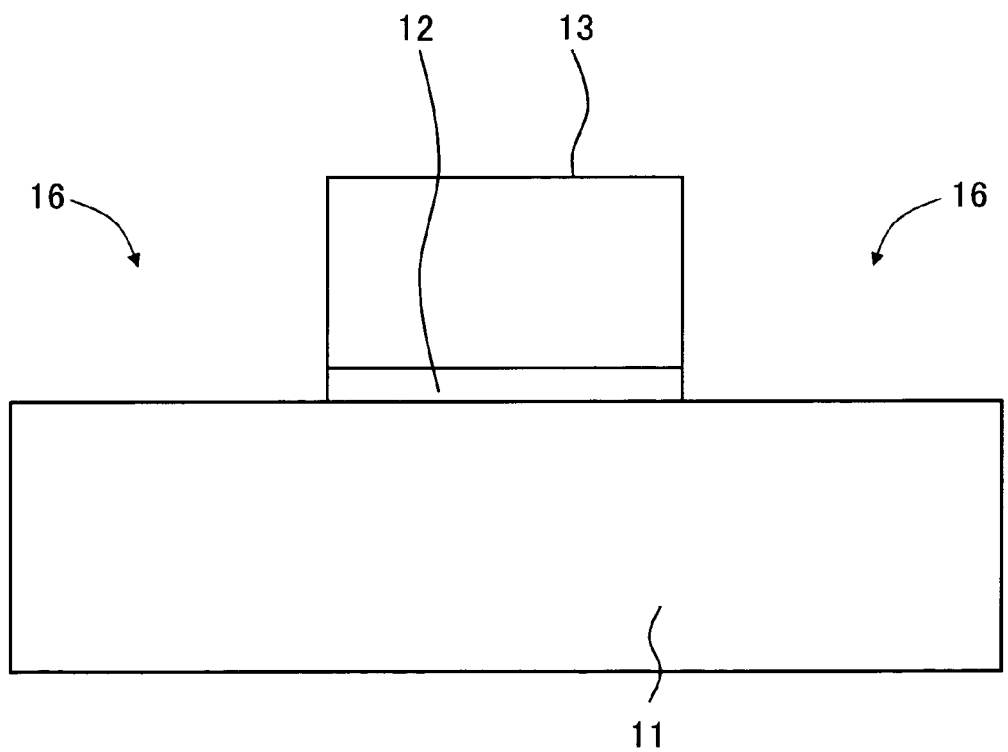
Fig. 11b1

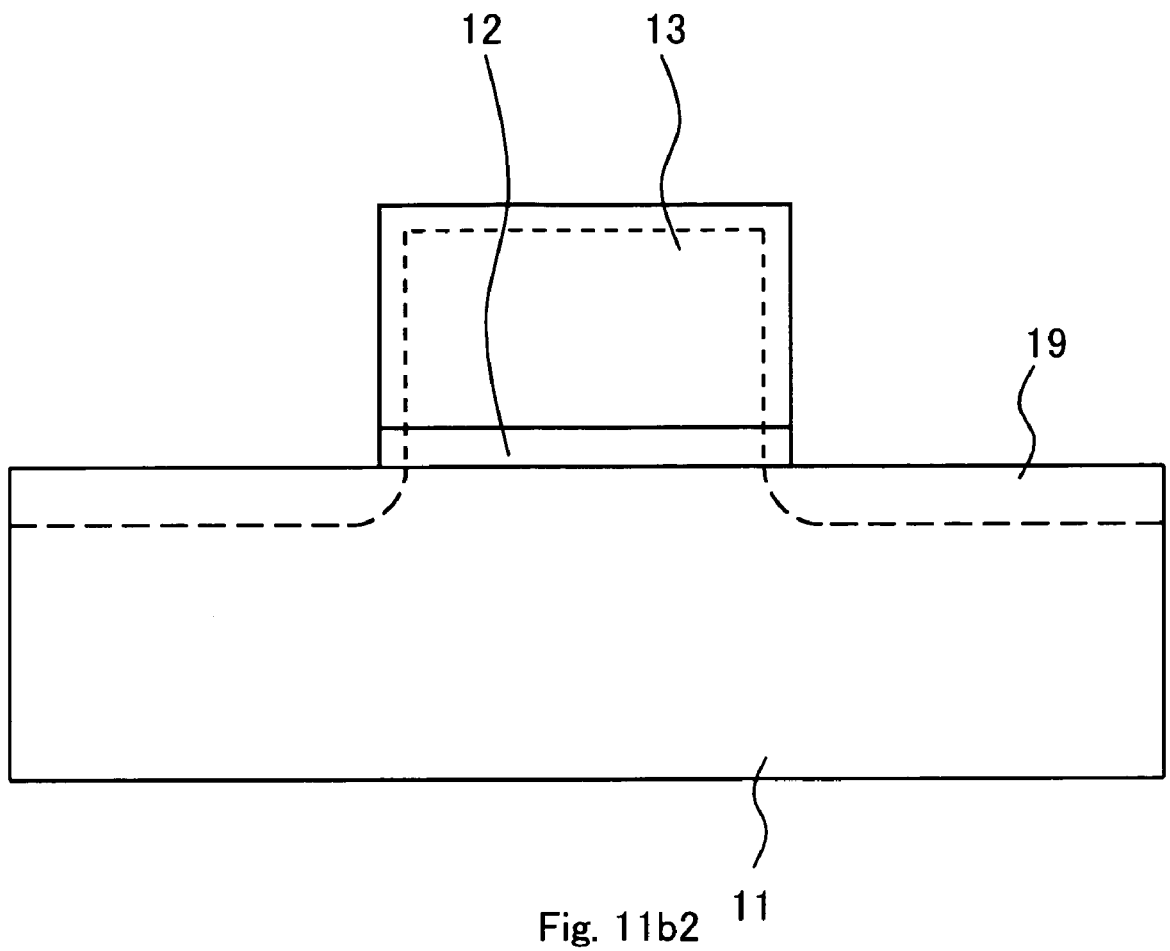
Fig. 11b2

Fig. 12b3

SEMICONDUCTOR MEMORY DEVICE AND METHOD OF MANUFACTURING THE SAME

CROSS REFERENCE TO RELATED APPLICATION

This Nonprovisional application claims priority under 35 U.S.C. §119(a) on Patent Application No. 2005-107328 filed in Japan on Apr. 4, 2005, the entire contents of which are hereby incorporated by reference.

BACKGROUND OF THE INVENTION

1. Field of the Invention

The present invention relates to a semiconductor memory device and particularly to a semiconductor memory device having field effect transistors functioned for converting a change in charge amount into an electric current.

2. Description of the Related Art

A non-volatile memory is known as one form of the conventional semiconductor memory device where one field effect transistor saves two bits of data (for example, as disclosed in Japanese Patent No. 2001-512290, equivalent to International Publication No. WO99/07000, referred to as Citation 1). Such a non-volatile memory will be described about the structure and the programming action.

The non-volatile memory of Citation 1 includes, as shown in FIG. 15, a gate electrode 909 provided via a gate insulating film on a P type well region 901 and a pair of N type diffusion areas 902 and 903 provided on the surface of the P type well region 901. The gate insulating film comprises so-called an ONO film (silicon oxide film/silicon nitride film/silicon oxide film) where a silicon nitride film 906 is sandwiched between two silicon oxide films 904 and 905. The silicon nitride film 906 includes memory regions 907 and 908 located close to ends of the two N type diffusion areas 902 and 903 respectively. In each of the memory regions 907 and 908, a two-bit data can be stored in one transistor by reading the drain current of a transistor from the quantity of charges.

The programming action on the non-volatile memory will now be described. The programming action involves injecting electrons into the memory regions 907 and 908. The action in Citation 1 is disclosed where the diffusion area 903 is supplied with 5.5 V and the gate electrode 909 is supplied with 10 V for injecting electrons into the memory region 908 at the right. For injecting electrons into the memory region 907 at the left, the diffusion area 902 is supplied with 5.5 V and the gate electrode 909 is supplied with 10 V. This allows each of the two memory regions 907 and 908 to be written down with a data. The other action is also disclosed for erasing or reading out a data on one of the two memory regions 907 and 908. Using those actions, the memory of two-bit data is feasible.

The gate insulating film in the non-volatile memory is arranged of the ONO, three-film, structure for driving the transistor and functioning as a memory film to save a charge. Accordingly, the non-volatile memory of Citation 1 is disadvantageous in the down sizing because its gate insulating film is hardly decreased in the thickness. Also, when the channel is shortened in the non-volatile memory, the two memory regions 907 and 908 of the transistor may interfere each other thus to interrupt the two-bit memory. Therefore, the down sizing of the non-volatile memory will fairly be restrictive.

Another semiconductor memory device is known which is capable of conducting the two-bit or more-bit memory with the use of one transistor and easily feasible of the down sizing (as disclosed, e.g., in Japanese Patent Laid-open Publication No. 2004-186663 (referred to as Citation 2)).

The fundamental structure as a memory device of the conventional semiconductor memory device will be described referring to FIGS. 16 and 17.

FIG. 16 is a schematic cross sectional view showing the memory device of Citation 2. As apparent from FIG. 16, the memory device includes a non-volatile memory cell which includes a gate electrode 13 having a gate length equal to that of a common transistor and provided via a gate insulating film 12 over an active region 11 of the first conduction type (e.g., one of P type and N type) formed on a part of a semiconductor substrate surface and a pair of charge retention sections 10A and 10B of a side wall spacer form provided on both sides of the gate electrode 13 and the gate insulating film 12 for memory of two-bit data. In other words, the charge retention section 10A is located on one side wall of the gate insulating film 12 and the gate electrode 13 while the other charge retention section 10B is located on the other side wall.

Two diffusion areas 17 and 18 of the second conduction type (e.g., the other of P type and N type) are provided at both sides of and beneath the charge retention sections 10A and 10B in the active region 11. The diffusion areas 17 and 18 (source/drain regions) are located as offset from the lowermost of the gate electrode 13 (from both ends of a channel region 41 provided beneath the gate electrode 13). Accordingly, in the active region 11, offset regions 42 are formed between the lowermost of the gate electrode 13 and the two diffusion areas 17 and 18 respectively.

As the charge retention sections 10A and 10B in the memory device are arranged independently of the gate insulating film 12, their memory function is isolated from the transistor function of the gate insulating film 12. Also, the charge retention sections 10A and 10B are separated from each other by the gate electrode 13, they can effectively be inhibited from interfering each other during the re-programming action. As the result, the memory device is capable of storing a two-bit or more-bit data and easily feasible of the down sizing.

Since the diffusion areas 17 and 18 are offset from the lowermost of the gate electrode 13, the inversion of the offset regions 42 beneath the charge retention sections 10A and 10B (at locations in the active region 11 opposite to the charge retention sections 10A and 10B) can be accelerated by the charge saved in the charge retention sections 10A and 10B, thus increasing the memory effect when the gate electrode 13 is supplied with a voltage. The memory effect indicates that the quantity of a change saved in the charge retention films (in the charge retention sections 10A and 10B) determines a change in the current flowing from one of the two diffusion areas to the other across the channel region 41 when the gate electrode 13 is supplied with a voltage. The higher the memory effect, the greater a change in the current will be increased.

As the diffusion areas 17 and 18 are offset from the gate electrode 13, the short channel effect will significantly be avoided as compared with a traditional logic transistor, hence decreasing the gate length to a shorter distance. Also, the structure suited for minimizing the short channel effect can employ the gate insulating film of a thickness greater than that of a logic transistor, hence improving the operational reliability.

FIG. 17 illustrates another example of the semiconductor memory device of Citation 2. In particular, each of the charge retention sections 10A and 10B shown in FIG. 16 comprises a silicon nitride film 15 as the second insulating film of a side wall shape and a silicon oxide film 14 as the first insulating film which isolates the silicon nitride film 15 from the gate electrode 13, the active region 11, and the diffusion areas 17 and 18. The silicon nitride film 15 has a function of retaining a charge (electrons or holes) while the silicon oxide film 14 has a function of inhibiting the leakage of a charge from the silicon nitride film 15.

More specifically, as shown in FIG. 17, the semiconductor memory device of Citation 2 comprises the action region of the first conduction type (e.g., one of P type or N type) formed on a part of a semiconductor substrate surface, the gate insulating film 12 provided on the action region, the gate electrode 13 provided on the gate insulating film 12, the charge retention sections 10A and 10B provided separately at both sides of the gate electrode 13, the diffusion areas 17 and 18 of the second conduction type (the other of P type and N type) provided separately beneath the charge retention sections 10A and 10B in the active region, and the channel region provided beneath the gate insulating film 12. In response to the quantity of charge saved therein, the charge retention sections 10A and 10B modifies the current which flows from one of the two diffusion areas 17 and 18 to the other across the channel region when the gate electrode 13 is supplied with a voltage. The charge retention sections 10A and 10B are arranged in which electrons or holes are injected and discharged for the memory of data.

The semiconductor memory device of Citation 2 serves as a memory device for converting a change in the charge saved in the charge retention sections 10A and 10B into an electric current. Since the two charge retention sections 10A and 10B provided at both sides of the gate electrode 13 are separated from the gate insulating film 12, their memory function is isolated from the transistor function of the gate insulating film 12. Accordingly, the gate insulating film 12 can be decreased in the thickness without interrupting the memory function, thus readily minimizing the short channel effect.

Also, since the two charge retention sections 10A and 10B provided at both sides of the gate electrode 13 are separated from each other by the gate electrode 13, they can effectively be prevented from being interfered by each other during the re-programming action. In other words, the distance between the two charge retention sections 10A and 10B is minimized. This allows the semiconductor memory device to store two-bit or more-bit data with the use of one transistor while being easily feasible of the down sizing.

However, the semiconductor memory device (non-volatile memory) of Citation 2 conducts the re-programming action with the lowermost (at both left and right sides) of its gate electrode supplied with an electric field during the memory action. If the first insulating film beneath the gate electrode fails to be uniform in the thickness, its thinner region may abruptly be intensified by the electric field. As the result, the first insulating film will be fractured thus causing the leakage of current.

For example, the silicon oxide film as the first insulating film is provided through reaction of silicon with specific gas (e.g., oxygen gas). When the supply of the gas is varied more or less, the resultant silicon oxide film may hardly be uniform in the thickness. Generally, the silicon oxide film is provided when the gate electrode has been deposited in the non-volatile memory. The supply of the gas may often be interrupted by the gate electrode and thus unstable at the lowermost of the gate electrode, hence resulting in a non-uniform thickness of the silicon oxide film.

FIGS. 18 and 19 are cross sectional views showing steps of a conventional method of manufacturing the semiconductor memory device. FIG. 20 is an enlarged view of FIG. 18c. As apparent from FIGS. 18b and 20, the semiconductor memory device manufactured by the conventional method has the opening provided at the bottom flush with the interface between the active region 11 and the gate insulating film 12. This prevents the thickness of the first insulating film 14 (of, e.g., silicon oxide) from being uniform particularly at both sides of the gate insulating film 12.

As disclosed, the charge retention sections in the semiconductor memory device of Citation 2 are located partially lower than the interface between the gate insulating film and the channel region. Since the charge retention sections in the semiconductor memory device are located partially lower than the interface between the gate insulating film and the channel region, they stay in the direction of propagation of the high energy charge during the programming action. Accordingly, the efficiency of injecting the charge into the charge retention sections can be improved, thus increasing the speed of the programming action. Simultaneously, the current during the programming action can be reduced. In the latter case, the power consumption during the programming action will thus be lowered. In more detail, the bottom of the opening is located at a distance of preferably 2 nm to 15 nm from the interface. The deeper the opening, the supply of the gas will increase. As the result, the silicon oxide film as the first insulating film can be uniform in the thickness. However, Citation 2 fails to disclose a method of manufacturing the semiconductor memory device which is capable of overcoming the drawbacks derived from the quality of the silicon oxide film. It is hence desired to invent a novel method of manufacturing the semiconductor memory device of which the first insulating film is uniform in the thickness.

SUMMARY OF THE INVENTION

The present invention has been developed in view of the above aspects and its object is to provide a method of manufacturing a semiconductor device which is high in the operational reliability with its charge retention film provided adjacent to and beneath the gate electrode and arranged of a uniform thickness.

For achievement of the above object, a method of manufacturing a semiconductor memory device according to the present invention is provided as a first feature comprising (a) a first step of providing a gate insulating film on an active region of the first conduction type which is formed on a part of a semiconductor substrate surface, (b) a second step of depositing a first conductive film on the gate insulating film, (c) a third step of processing the first conductive film, the gate insulating film, and the active region to provide at least one opening of which the bottom is located below the interface between the active region and the gate insulating film and then providing a gate electrode surrounded by the opening or between the openings, (d) a fourth step of depositing a first insulating film which covers the side and bottom surface of the opening, (e) a fifth step of depositing a second insulating film over the first insulating film, (f) a sixth step of shaping the first insulating film and the second insulating film into a side wall spacer shape by etching thus to provide charge retention sections onto the opening at both sides of the gate electrode, and (g) a seventh step of providing diffusion areas of the second conduction type, which is different from the first conduction type, at opposite sides of the gate electrode beneath the charge retention sections in the active region.

The method of manufacturing a semiconductor memory device of the first feature according to the present invention may be modified in which the third step includes arranging a side wall of the opening beneath the lower side of the gate insulating film to a tilted form which becomes further distanced from the gate electrode as being closer to the bottom of the opening.

The method of manufacturing a semiconductor memory device of the first feature according to the present invention may be modified in which the third step includes a sub step of processing the first conductive film and the gate insulating film to provide the opening, a sub step of providing a fourth insulating film which covers the side and bottom surface of the opening, and a sub step of removing the fourth insulating film. The method of manufacturing a semiconductor memory device of the first feature according to the present invention may further be modified in which the fourth insulating film is a silicon oxide film.

Any of the foregoing methods of manufacturing a semiconductor memory device according to the present invention may further comprise a step of depositing a third insulating film on the second insulating film after the fifth step of depositing the second insulating film and the sixth step includes processing the first insulating film, the second insulating film, and the third insulating film to a side wall spacer form by etching. The method of manufacturing a semiconductor memory device according to the present invention may be modified in which the third insulating film is a silicon oxide film. Any of the foregoing methods of manufacturing a semiconductor memory device according to the present invention may be modified in which the first insulating film is a silicon oxide film. Any of the foregoing methods of manufacturing a semiconductor memory device according to the present invention may be modified in which the second insulating film is a silicon nitride film.

According to the method of manufacturing a semiconductor memory device of the first feature, the active region is processed together with the first conductive film and the gate insulating film at the third step for determining the shape of the gate insulating film and the gate electrode, whereby the semiconductor memory device can be implemented with its charge retention sections located partially lower than the interface between the gate insulating film and the channel region. If the supply of the gas is varied during the provision of the silicon oxide film as the first insulating film, the resultant silicon oxide film may hardly be uniform in the thickness. The method of manufacturing a semiconductor memory device according to the present invention allows the opening to be provided with its bottom located below the interface between the active region and the gate insulating film. As the result, the gas can incrementally be supplied towards the bottom of the opening. As the supply of the gas is increased adjacent to and beneath the gate electrode, the first insulating film can be provided of a uniform thickness.

According to the method of manufacturing a semiconductor memory device of the first feature, the side wall of the opening beneath the lower side of the gate insulating film is arranged to a tilted (taper) form at the third step which becomes further distanced from the gate electrode as being closer to the bottom of the opening. The greater the angle of the side wall to the bottom of the opening, the more the supply of the gas will increase. As the result, the silicon oxide film as the first insulating film can be uniform in the thickness. The tilted side wall is not limited to a flat surface but may be shaped of a rounded surface.

The method of manufacturing a semiconductor memory device according to the present invention allows the charge retention sections to consist mainly of the second insulating film having a function of retaining a charge and a first insulating film and a third insulating film both having a function of inhibiting the charge retained in the second insulating film from escaping out, where the second insulating film may be sandwiched between the first insulating film and the third insulating film. As the result, the charge injected into the charge retention sections can be inhibited by the first and third insulating films from escaping out and thus efficiently be saved in the first insulating film. Therefore, the semiconductor memory device manufactured by the method of manufacturing a semiconductor memory device according to the present invention can be improved in the efficiency of charging the charge retention sections and thus hastened in the re-programming (programming and erasing) action.

The method of manufacturing a semiconductor memory device according to the present invention allows the first insulating film adjacent to and beneath the gate electrode to be uniform in the thickness, thus avoiding any dielectric breakdown by the electric field concentration due to non-uniform thickness of the insulating film. Also, as the two charge retention sections at both sides of the gate electrode are isolated from the gate insulating film, their memory function can be isolated from the transistor function of the gate insulating film. Accordingly, the gate insulating can be thinned without sacrificing the memory function, thus minimizing the short channel effect with much ease. Moreover, as the two charge retention sections at both sides of the gate electrode are separated from each other by the gate electrode, their interference with each other can be effectively attenuated during the re-programming action. In other words, the distance between the two charge retention sections is minimized. As the result, the semiconductor memory device manufactured by the method of the present invention can thus save two-bit or more-bit data while being readily feasible of the down sizing.

Furthermore, since the charge retention sections are located partially lower than the interface between the gate insulating film and the channel region, they stay in the direction of propagation of the high energy charge during the programming action. Accordingly, the efficiency of injecting the charge into the charge retention sections can be improved, thus increasing the speed of the programming action. Simultaneously, the current during the programming action can be reduced, hence favorably decreasing the power consumption at the programming action.

BRIEF DESCRIPTION OF THE DRAWINGS

FIG. 11 is a cross sectional view showing steps of the seventh embodiment of a method of manufacturing a semiconductor memory device according to the present invention;

DETAILED DESCRIPTION OF THE INVENTION

Some embodiments of a method of manufacturing a semiconductor memory device according to the present invention (referred to as the inventive method hereinafter) will be described referring to the relevant drawings.

First Embodiment

The first embodiment of the inventive method will be described referring to FIGS. 1 to 4. FIGS. 1 and 2 are cross sectional views illustrating steps of the inventive method. FIG. 3 illustrates the positional relationship between a gate insulating film and charge retention sections in a memory device manufactured by the inventive method. FIG. 4 illustrates a programming action of the semiconductor memory device (memory device) manufactured by the inventive method.

Figure 2D:
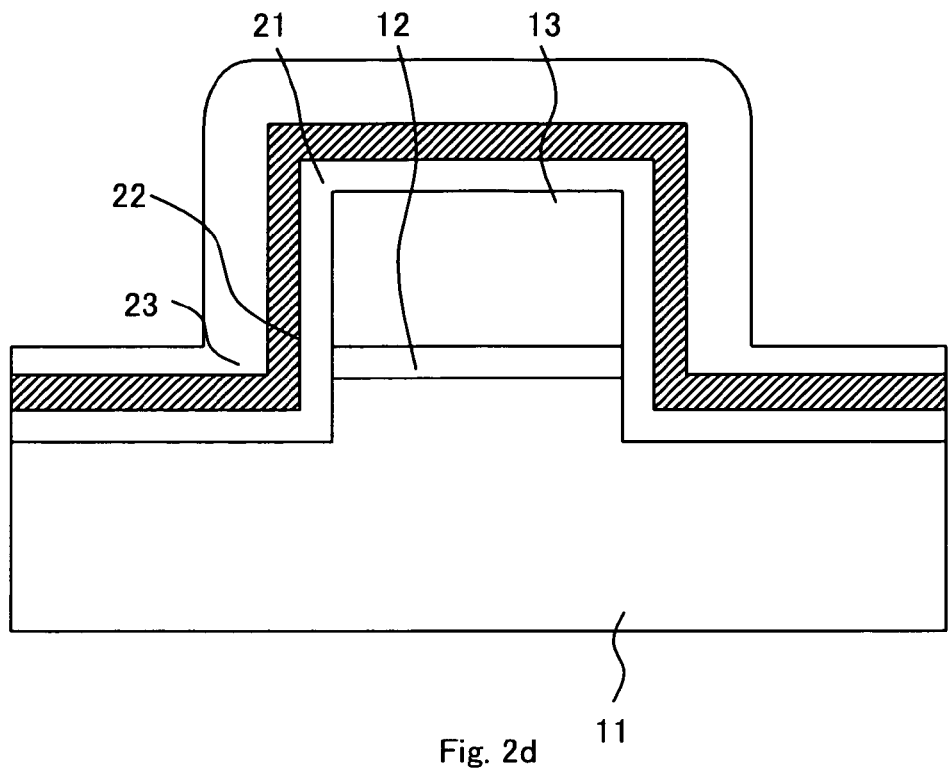
FIG. 2 is a cross sectional view showing steps of the first embodiment of the method of manufacturing a semiconductor memory device according to the present invention.
Figure 2E:
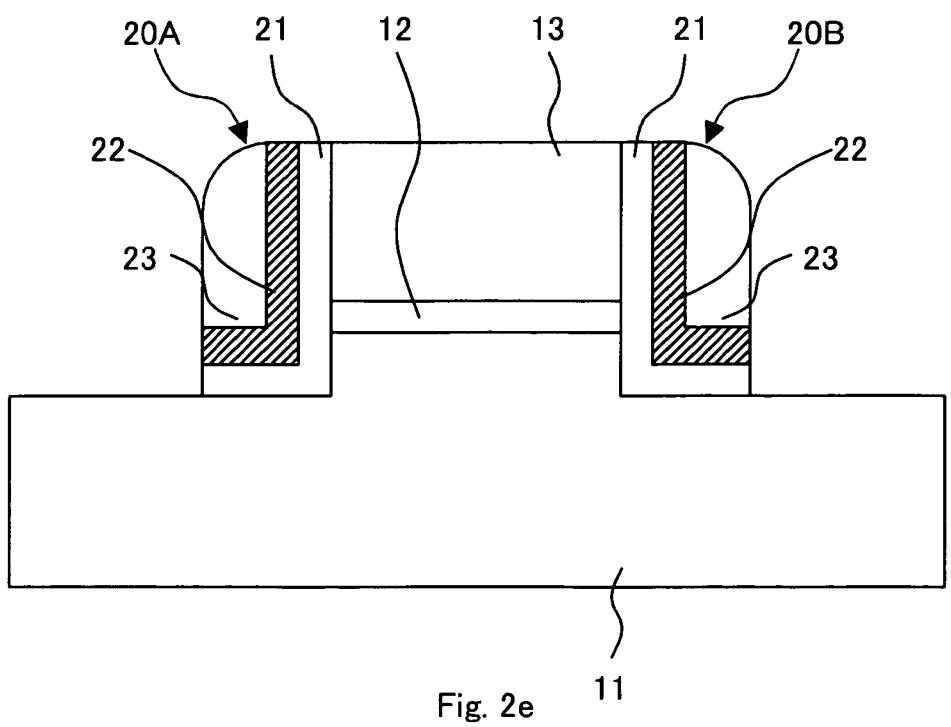
Figure 2F:
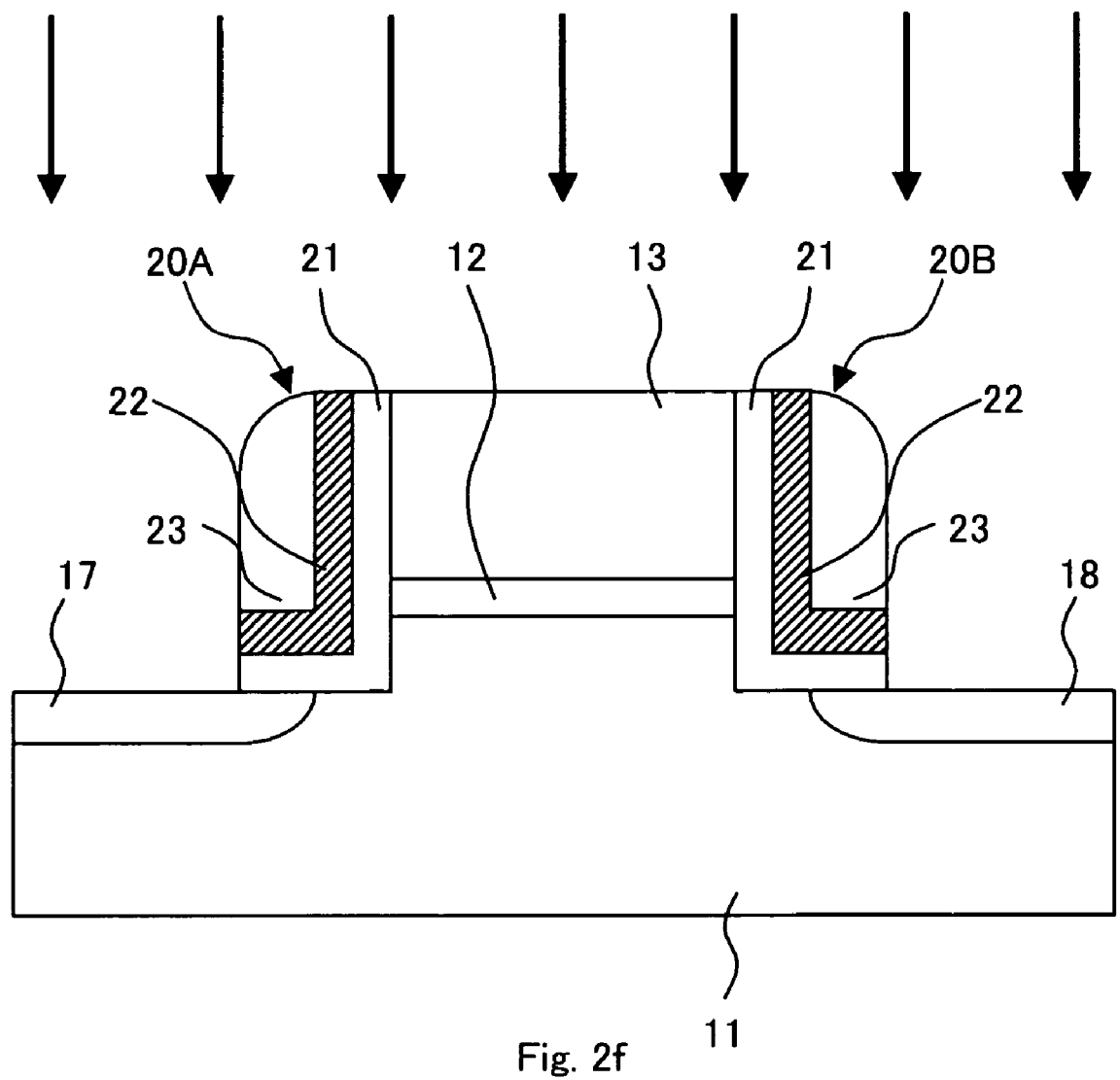

As shown in FIG. 2f, the charge retention sections 20A and 20B of the semiconductor memory device manufactured by the inventive method are located partially lower than the interface between the gate insulating film 12 and an active region 11. The semiconductor memory device manufactured by the inventive method comprises the gate insulating film 12 provided on the active region 11 of a first conduction type (for example, P type) formed on a part of a semiconductor substrate surface, the gate electrode 13 provided on the gate insulating film 12, the charge retention sections 20A and 20B provided at both sides of the gate insulating film 12 and the gate electrode 13 (gate electrode region) on the active region 11, a source/drain region (diffusion area such as N type diffusion area) provided at a position opposite to the gate electrode 13 beneath the charge retention sections 20A and 20B in the active region 11 so as to partially confront the charge retention sections 20A and 20B respectively, and a channel region provided in the active region 11 beneath the gate insulating film 12. Steps of the inventive method will now be described.

Figure 1A:
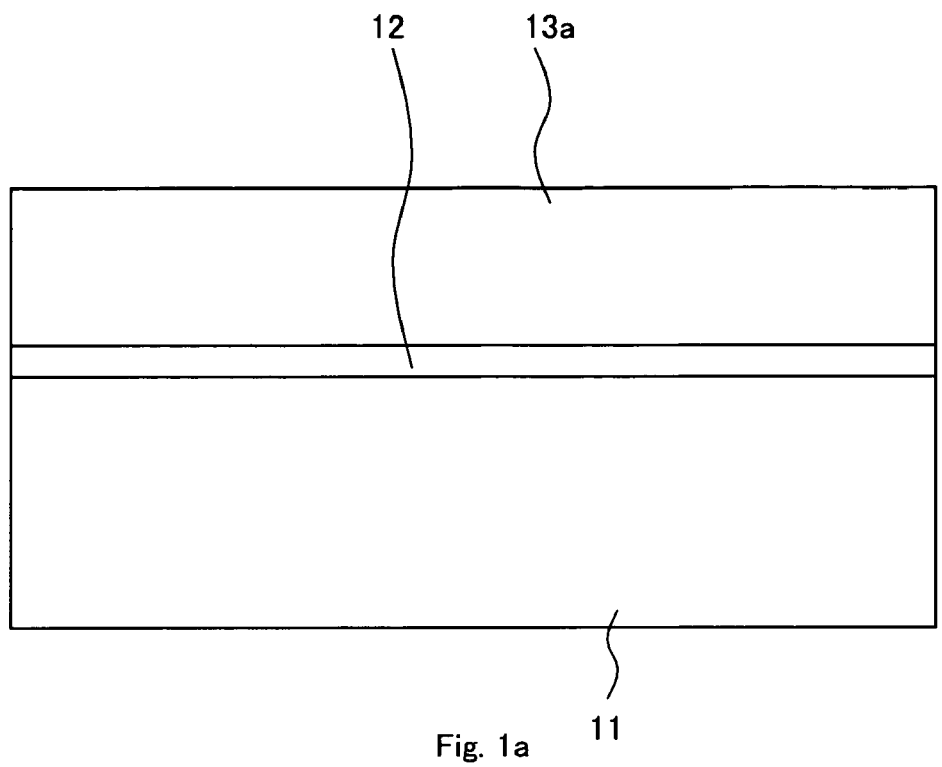
FIG. 1 is a cross sectional view showing steps of the first embodiment of a method of manufacturing a semiconductor memory device according to the present invention.

As shown in FIG. 1a, the method starts with providing the gate insulating film 12 on the active region 11 of the first conduction type (for example, P type) which has been formed on a part of the semiconductor substrate surface (as Step 1). The active region 11 extends excluding the device separating regions provided on the semiconductor substrate, where a transistor is developed as separated by the device separating regions. The gate insulating film 12 may be a film of, e.g., silicon oxide provided by an oxidizing action in a diffusion furnace. Then, a first conductive film 13a which will be turned to the gate electrode 13 is deposited on the gate insulating film 12 by a chemical vapor deposition (CVD) of, e.g., poly-silicon (as Step 2).

Figure 1B:
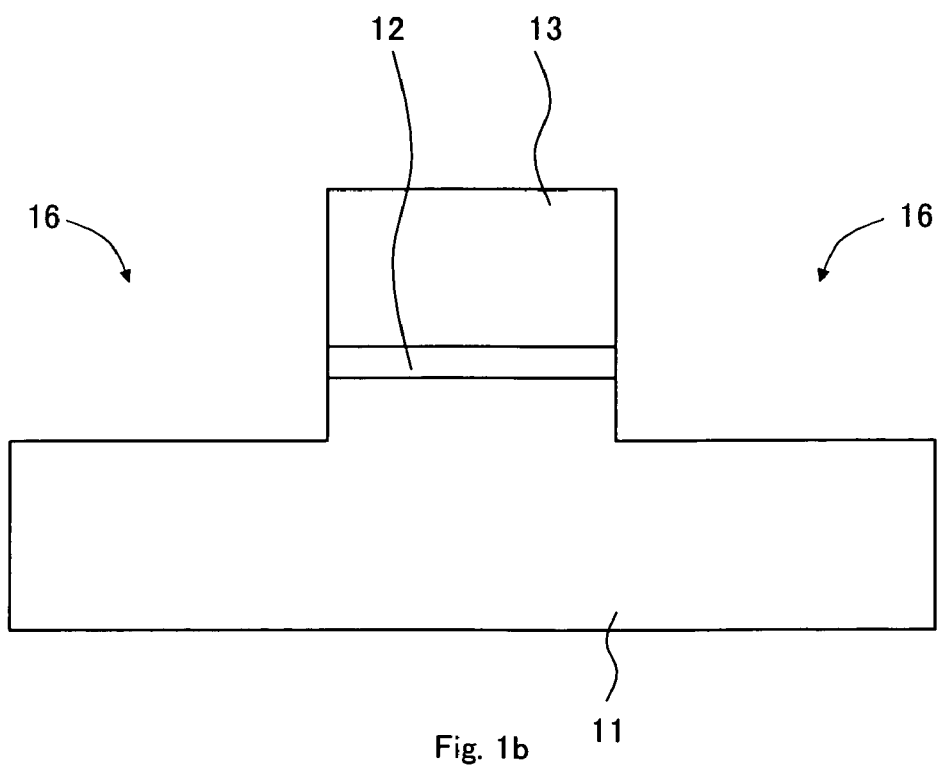

This is followed by, as shown in FIG. 1b, processing the first conductive film 13a, the gate insulating film 12, and the active region 11 to provide an opening 16 of which the bottom is located at the side of the active region 11 of the interface between the active region 11 and the gate insulating film 12 (as Step 3). As the first conductive film 13a is defined by the opening 16, it turns to the gate electrode 13. More particularly, this step includes providing a pattern using a photolithographic technique and carrying out a reactive ion etching (RIE) action with the pattern used as a masking to provide the opening 16. The opening 16 provided by the RIE action is shaped across the thickness of the first conductive film 13a and the gate insulating film 12 to a depth of 2 nm to 15 nm from the surface of the active region 11.

Figure 1C:
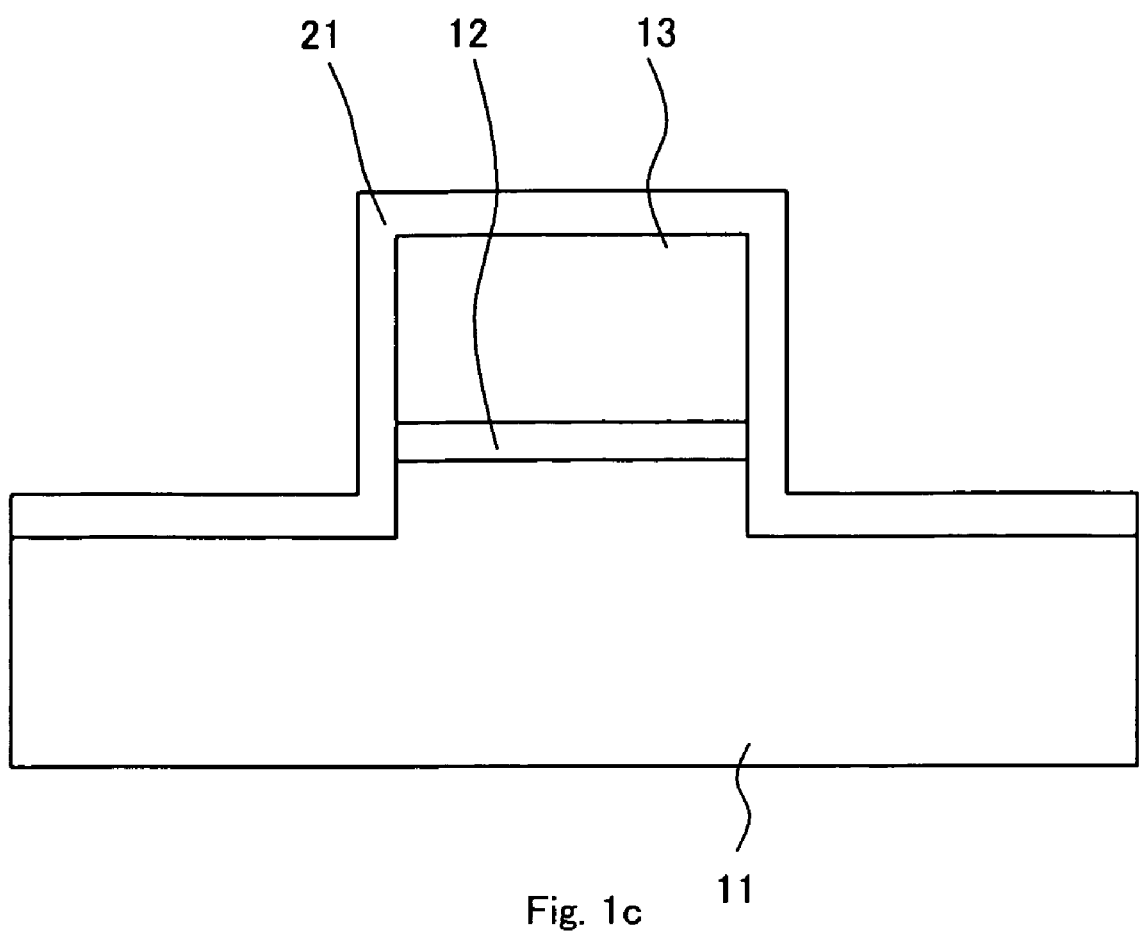

This is followed by, as shown in FIG. 1c, providing a first insulating film 21 which covers the sides and the bottom surface of the opening 16 (as Step 4). More particularly, this step involves forming a silicon oxide film by an oxidizing action in a furnace to develop the first insulating film 21 which will be a part of the charge retention section. The sides of the opening 16 are identical to the side walls of the gate electrode 13, the gate insulating film 12, and the active region 11 which extends and defines the channel region provided beneath the gate electrode 13. Then, as shown in FIG. 2d, a second insulating film 22 is deposited in the form of, e.g., a silicon nitride film by a CVD method on the first insulating film 21 (as Step 5). In addition, after depositing the second insulating film 22, a third insulating film 23 is deposited on the second insulating film 22, as shown in FIG. 2d. Specifically, the third insulating film 23 may be a silicon oxide film deposited by a CVD method.

This is followed by, as shown in FIG. 2e, etching the first insulating film 21, the second insulating film 22, and the third insulating film 23 by an RIE action to develop charge retention sections 10A and 10B of a side wall spacer shape at both sides of the gate insulating film 12 and the gate electrode 13 at the opening 16 (as Step 6). Then, as shown in FIG. 2f, the diffusion areas 17 and 18 of the second conduction type (for example, N type) which is different from the first conduction type are provided at positions opposite to the gate electrode 13 beneath the charge retention sections 10A and 10B respectively in the active region 11 (as Step 7). More particularly, the diffused (source/drain) regions 17 and 18 are provided by implanting impurities such as arsenic (As) at an angle of zero or completely vertical to the surface of the semiconductor substrate. The impurities may be selected from the fifth group in the periodic table of elements (for example, phosphate P).

The inventive method is particularly characterized by the third and fourth steps shown in FIGS. 1b and 1c. At the third step shown in FIG. 1b, the opening 16 is shaped so that its bottom is located lower than the interface between the active region 11 and the gate insulating film 12 or preferably to a depth of 2 nm to 15 nm from the surface of the active region 11. As the result, when a silicon oxide film of the first insulating film 21 is provided at the fourth step shown in FIG. 1c, the distribution of oxidizing gas can be increased to each corner between the side and the bottom of the opening 16 thus contributing to a uniform thickness of the first insulating film 21.

As described, the inventive method of this embodiment allows the first insulating film 21 to be uniformly provided in the form of, e.g., a silicon oxide film beneath the gate electrode 13, hence minimizing the concentration of charge causing any fracture of the insulating film during the re-programming action of the memory device. Also, the memory device manufactured by the inventive method of this embodiment (See FIG. 2f) permits the charge retention sections 20A and 20B to remain partially closer to the active region 11 or lower than the interface between the gate insulating film 12 and the active region 11, thus contributing to the speeding up of the programming action. More specifically, the charge retention sections 20A and 20B in the semiconductor memory device of this embodiment are located along the direction of high-energy charging during the programming action. As the efficiency of charging to the charge retention sections 20A and 20B is improved, the speed of the programming action can increase. Simultaneously, as the current is minimized during the programming action, the consumption of overall power can be lowered.

In the memory device of this embodiment, the charge retention sections 20A and 20B is arranged to have a construction where the silicon nitride film 22 of the second insulating film for trapping a charge is sandwiched between the two silicon oxide films 21 and 23 as the first insulating film and the third insulating film respectively. This allows a charge received by the charge retention sections 20A and 20B to be blocked with the silicon oxide film 23 and accumulated effectively in the silicon nitride film 22. Since the charge retention sections 20A and 20B have the silicon nitride film 22 sandwiched between the two silicon oxide films 21 and 23, their charged action can be increased in the efficiency thus contributing the speeding up of the re-programming action (programming and erasing action). Moreover, since the silicon nitride film 22 for accumulating a charge is arranged of a film form, a charge density in the silicon nitride film 22 can be increased quickly by a charge injection as well as made uniform. Accordingly, the memory device can be free from declination in the operational reliability which occurs when charge fluctuation in the silicon nitride film 22 is triggered by a non-uniform distribution of charge. Also, the silicon nitride film 22 for accumulating a charge is isolated by another insulating film from the conductors (the gate electrode, the diffusion areas, and the active region), thus permitting no leakage of the charge and ensuring a high degree of the data retention capability.

Moreover, since the charge retention sections 20A and 20B in the semiconductor memory device of this embodiment are arranged independently of the gate insulating film 12 and located at both sides of the gate electrode 13, they can retain more than two bits of data. Simultaneously, the charge retention sections 20A and 20B are separated from each other by the gate electrode 13 and can thus be protected effectively from interference from each the other during the re-programming action. Also, since the transistor function of the gate insulating film 12 is isolated from the memory function of the charge retention sections 20A and 20B, the gate insulating film 12 can be decreased in the thickness thus minimizing a short channel effect and contributing the down sizing of the memory device.

A desired example of the positional relationship between the gate insulating film 12 and the charge retention sections 20A and 20B will now be explained referring to FIG. 3. It is assumed that the distance from the (first) interface between the gate insulating film 12 and the active region 11 to the (second) interface between the charge retention sections 20A and 20B (the first insulating film 21) and the active region 11 is D and the thickness of the silicon oxide film 21 separating the silicon nitride film 22 and a pair of the diffusion areas 17 and 18 from each other is T.

As the silicon oxide film 21 in the memory device of this embodiment inhibits the charge accumulated in the silicon nitride film 22 from escaping out, its thickness T may preferably be not smaller than 2 nm. If the thickness of the silicon oxide film 21 is smaller than 2 nm, its channel tunneling effect will be increased thus shortening the data retention period of the memory device.

It is also preferable in the memory device of this embodiment that the distance D between the first interface and the second interface stays within a range from 2 nm to 15 nm. If the distance D is smaller than 2 nm with the silicon oxide film 21 of 2 nm or greater in thickness T, the silicon nitride film 22 may be located not lower than the (first) interface between the gate insulating film 12 and the active region 11. In the latter case, the silicon nitride film 22 may not directly receive electrons accelerated by the drain electric field during the programming action hence declining the efficiency of the programming action. On the other hand, when the distance D is 15 nm or more, the regions (denoted by 81 in FIG. 3a) where the gate electric field hardly cover and the inversion film are hardly produced will increase. This results in significant drop down in the driving current in the transistor, hence increasing the duration required for the read-out action. Therefore, the distance D is preferably within a range from 2 nm to 15 nm. Thanking for this positional relationship, the memory device manufactured by the inventive method of the present embodiment allows the charge retention sections 20A and 20B to be positioned at optimum in relation to the gate insulating film 12 and its operating speed can stay at favorably a higher rate.

Figure 3A:
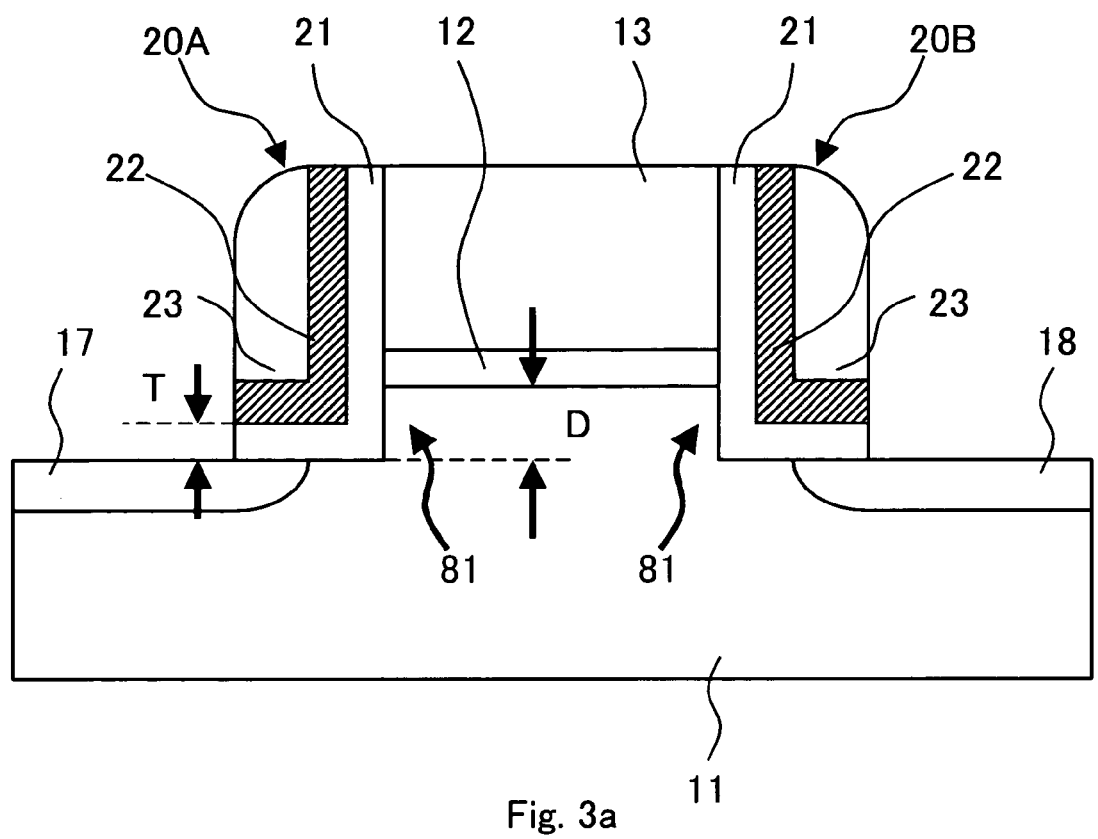
FIG. 3 is an explanatory view showing the positional relationship between a gate insulating film and a pair of charge retention sections in the semiconductor memory device manufactured by the method of the present invention.
Figure 3B:
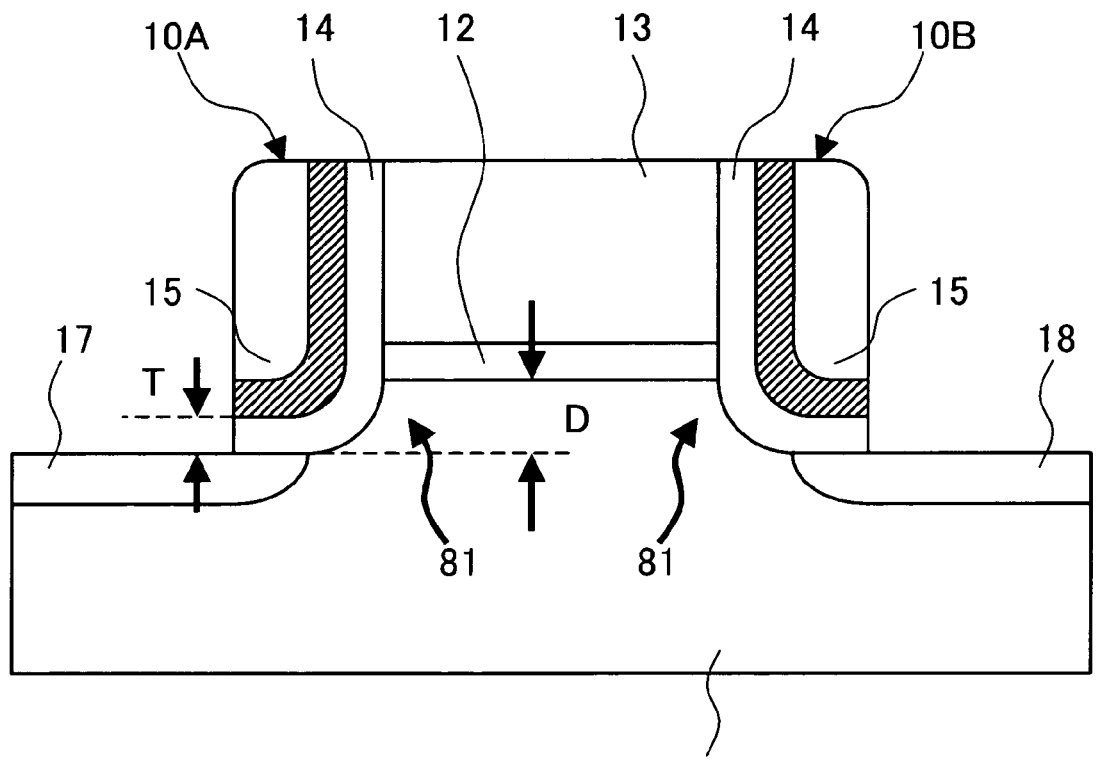

Although the silicon oxide film 21 is arranged of a right-angle L shape in the cross section shown in FIG. 3a, its shape may have a rounded corner as shown in FIG. 3b. In the latter case, the overall structure of the memory device shown in FIGS. 1 and 2 is turned to a rounded structure shown in FIG. 3b. As the silicon oxide film 21 is rounded at the corner, the electric field can be prevented from being intensified at the corner thus improving the electrical characteristics and the operational reliability of the memory device.

The programming action of the memory device manufactured by the inventive method of the present invention will be explained referring to FIG. 4. The programming action involves injecting electrons into the charge retention sections when the memory device is of N type. When the memory device is of P type, the programming action means supplying the charge retention sections with holes. The programming action of the memory device of the present embodiment starts with injecting electrons accelerated by the drain electric field into the charge retention sections 20A and 20B.

Figure 4A:
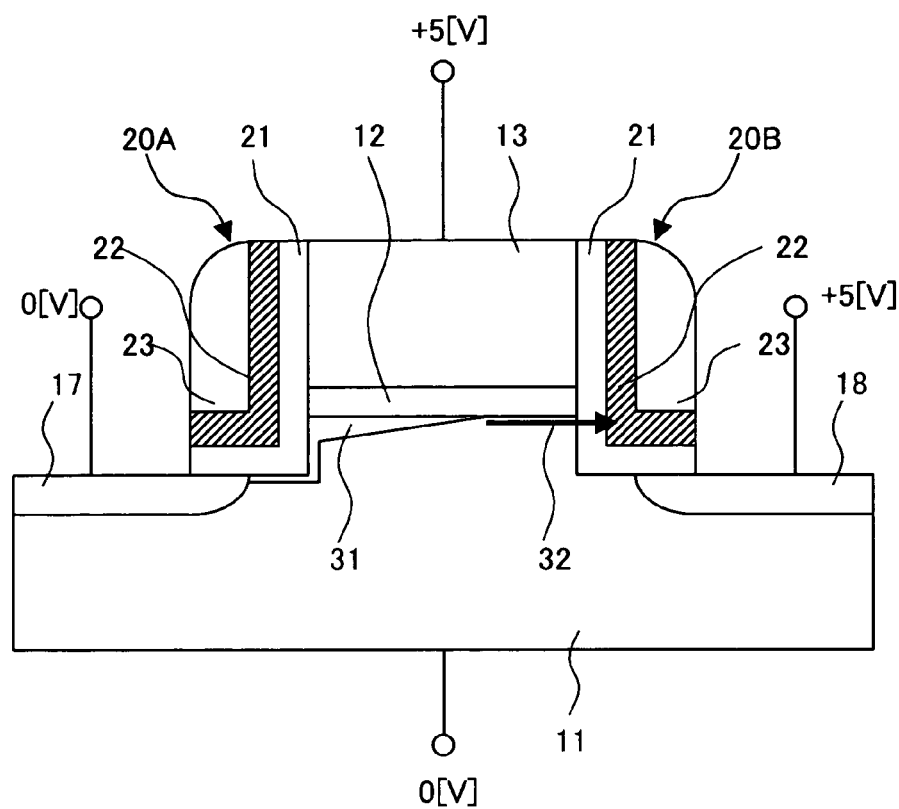
FIG. 4 is an explanatory view of a programming action on the charge retention sections.

The programming action on the charge retention section 20B (of injecting of electrons into the charge retention section 20B) will first be explained referring to FIG. 4a. As shown in FIG. 4a, for example, the diffusion area 17 acting as a source electrode and the active region 11 both are fed with 0 V while the other diffusion area 18 acting as a drain electrode and the gate electrode 13 are fed with +5 V. With the voltages are applied in the above manner, the inversion layer 31 is produced as extended from the diffusion area 17 (source electrode) but not reached to the diffusion area 18 (drain electrode), thus developing a pinch-off point. The electrons are accelerated by the drain electric field from the pinch-off point to the other diffusion area 18 (drain electrode) in a direction denoted by the arrow 32 and injected into the charge retention section 20B (more precisely, the silicon nitride film 22 in the charge retention section 20B). As the charge retention section 20B has been filled with the electrons, the programming action is completed. Since the electrons are not accelerated adjacent to the charge retention section 20A, no programming action will be carried out on the charge retention section 20A.

Figure 4B:
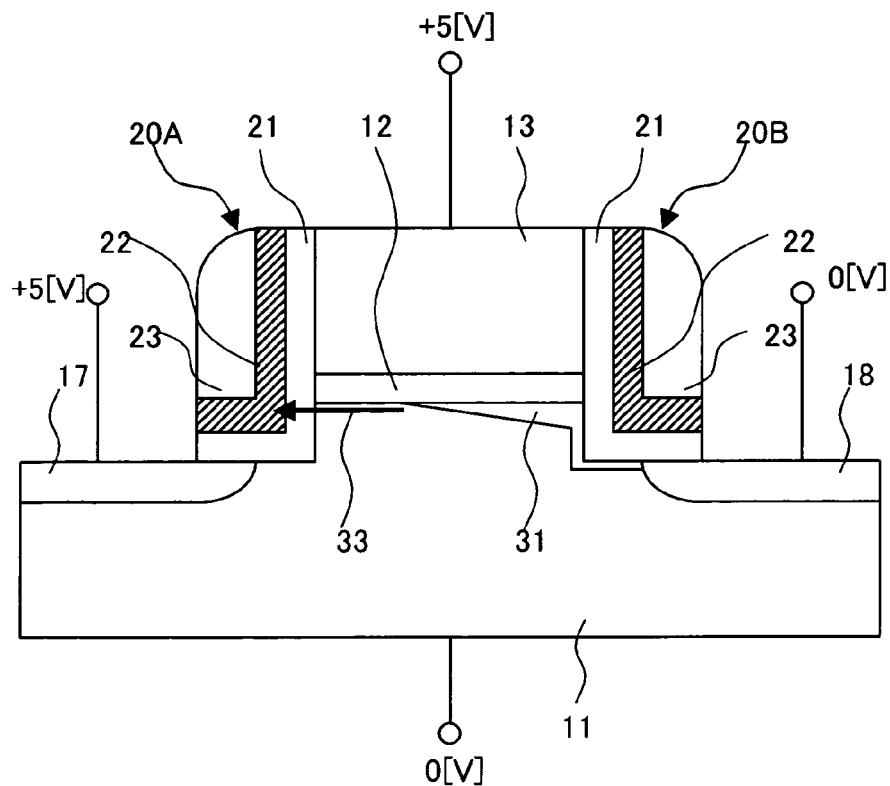

Then, the programming action on the charge retention section 20A (of injecting of electrons into the charge retention section 20A) will be explained referring to FIG. 4b. As shown in FIG. 4b, for example, the diffusion area 18 acting as a source electrode and the active region 11 both are fed with 0 V while the other diffusion area 17 acting as a drain electrode and the gate electrode 13 are fed with +5 V. When the voltages are applied in the above manner, the electrons are accelerated in an opposite direction denoted by the arrow 33 and injected into the silicon nitride film 22 in the charge retention section 20A. The programming action on the charge retention section 20A can be conducted when the diffusion areas 17 and 18 are supplied with the voltages switched over from those applied to the charge retention section 20B.

Figure 16:
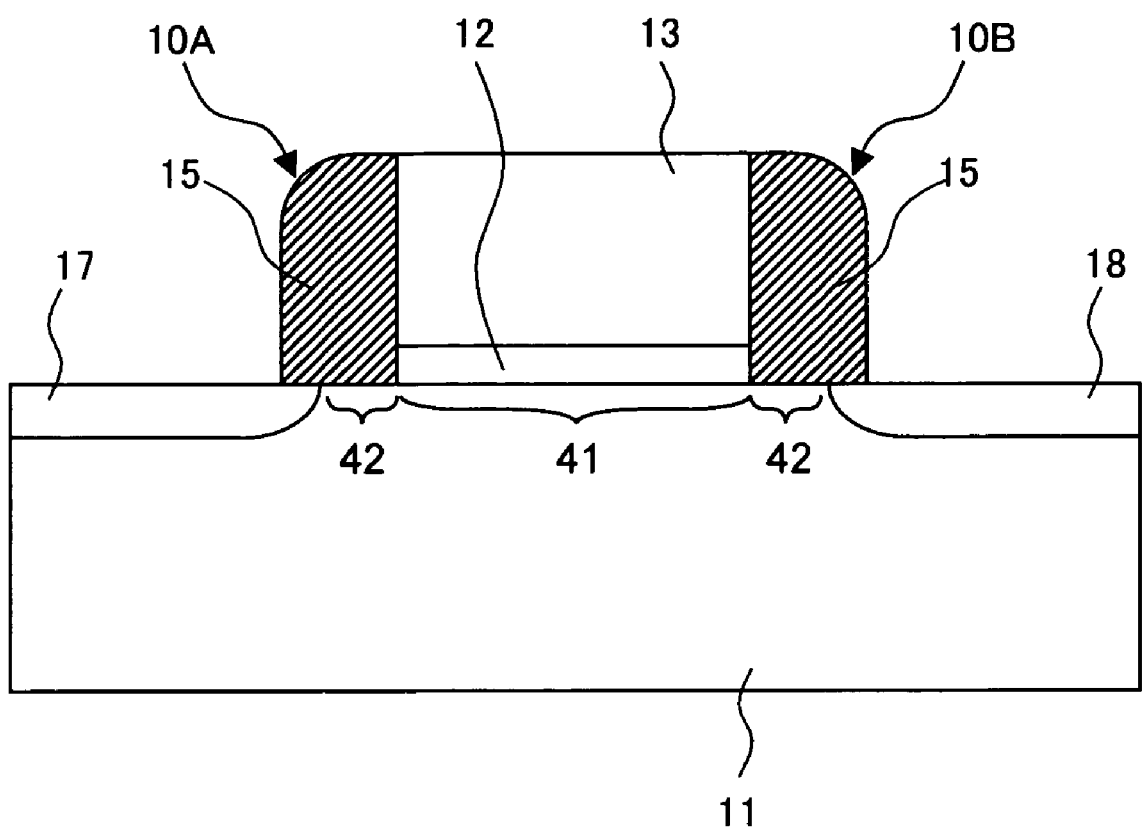
FIG. 16 is a schematic cross sectional view showing a fundamental structure of another conventional semiconductor memory device.
Figure 17:
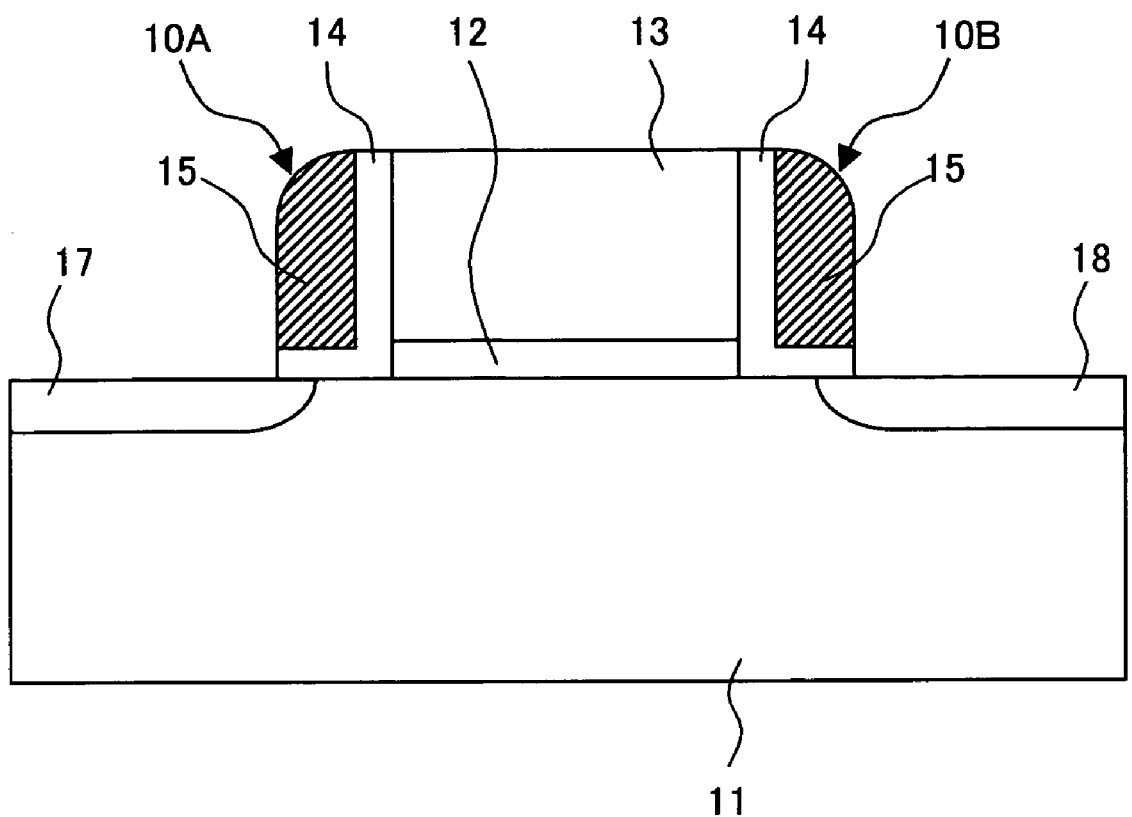
FIG. 17 is a schematic cross sectional view showing a fundamental structure of a further conventional semiconductor memory device.
Figure 18A:
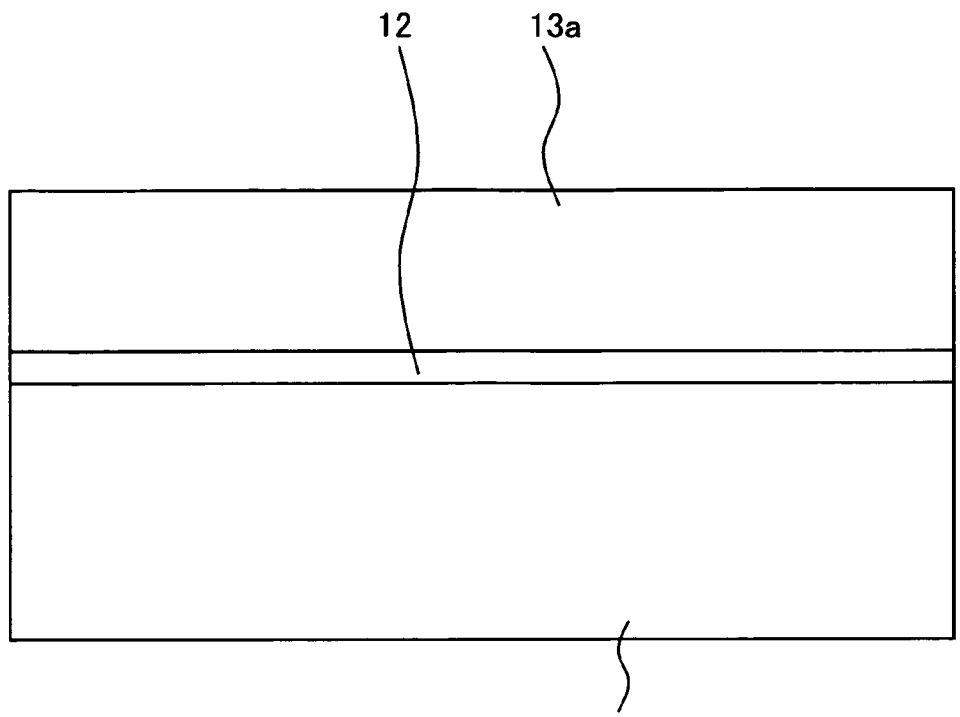
FIG. 18 is a cross sectional view showing steps of a conventional method of manufacturing a semiconductor memory device.
Figure 18B:
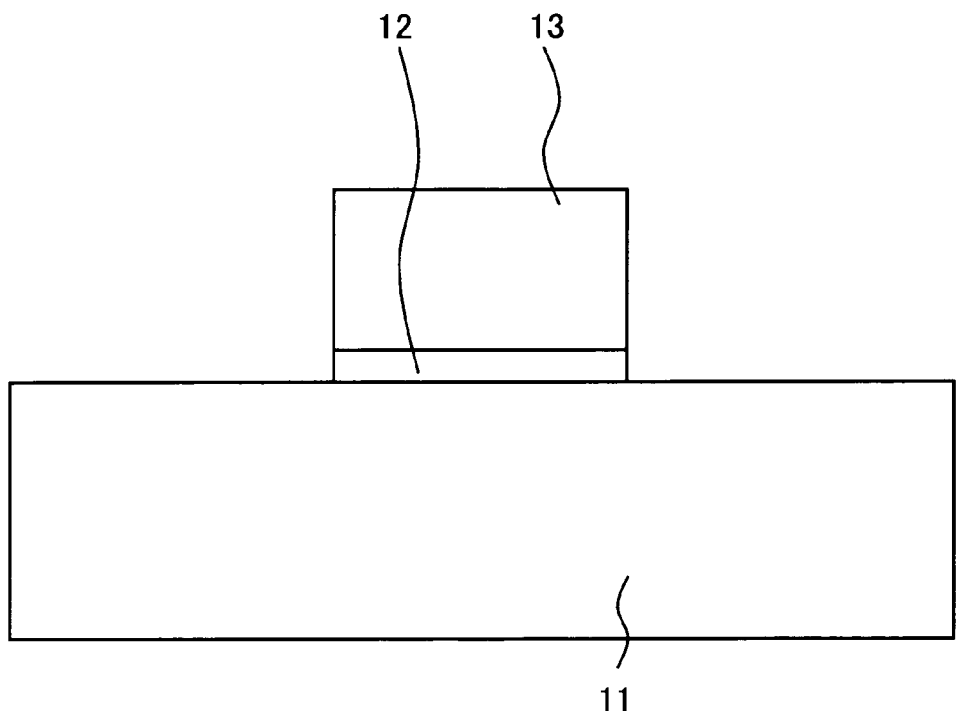
Figure 18C:
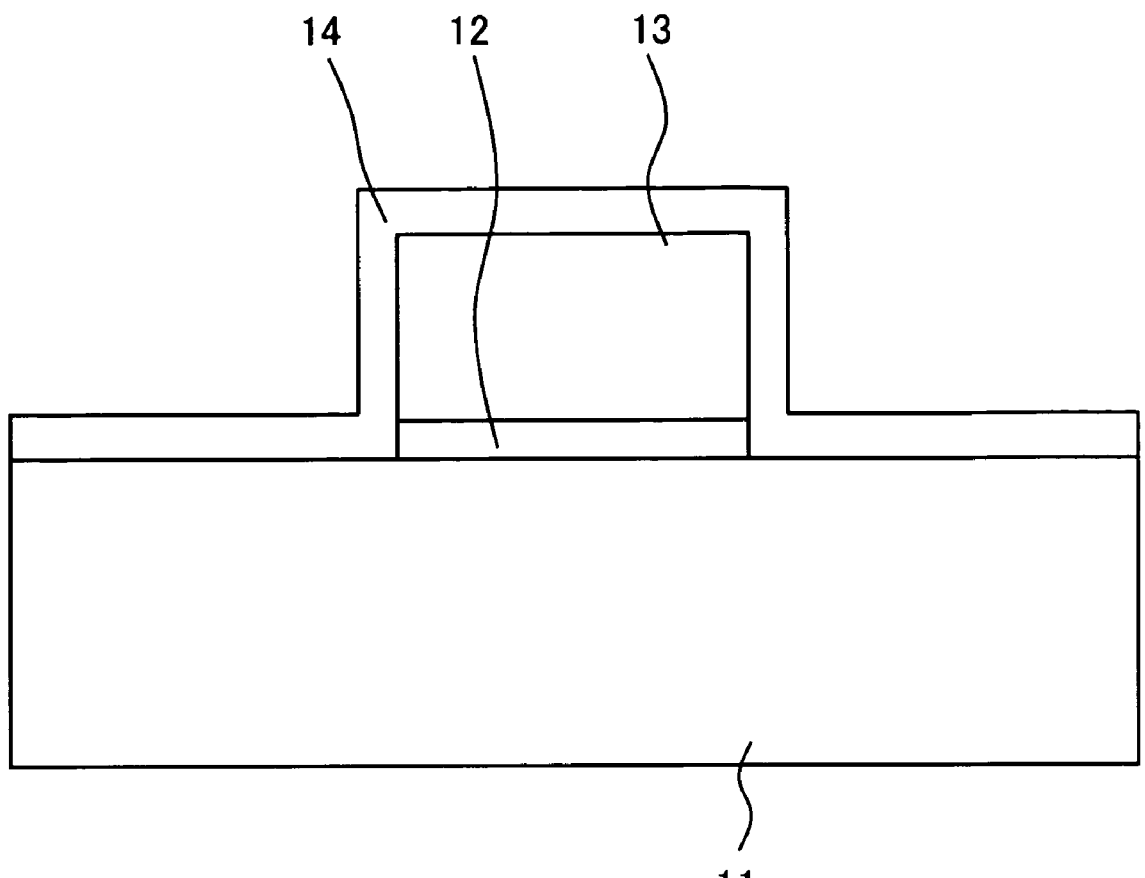
Figure 19D:
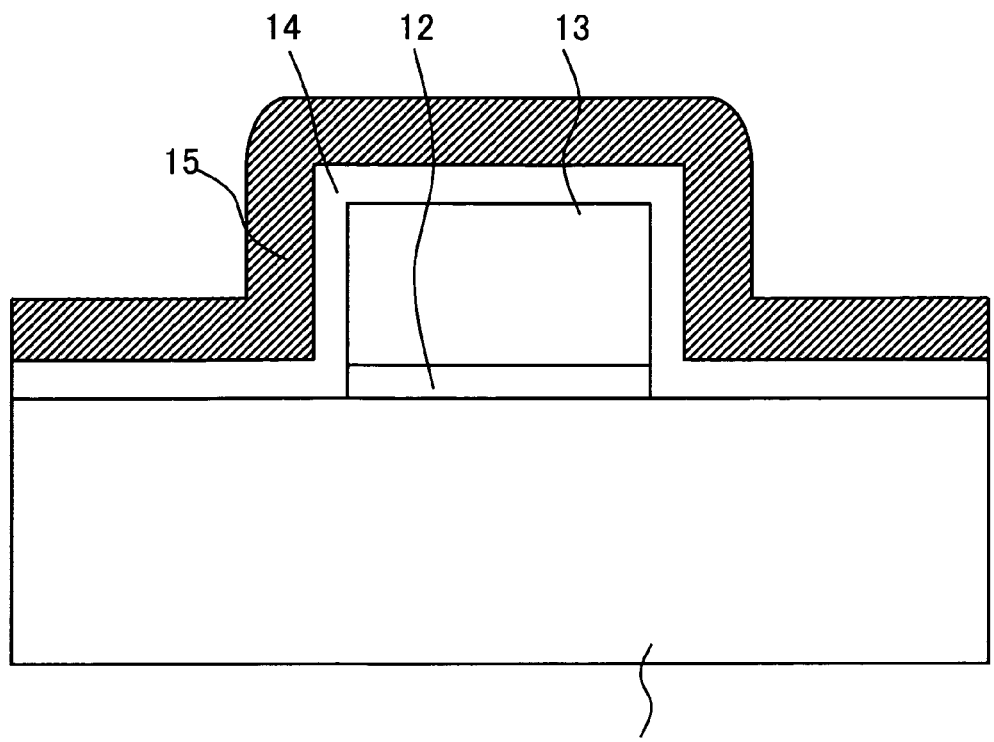
FIG. 19 is a cross sectional view showing steps of another conventional method of manufacturing a semiconductor memory device.
Figure 19E:
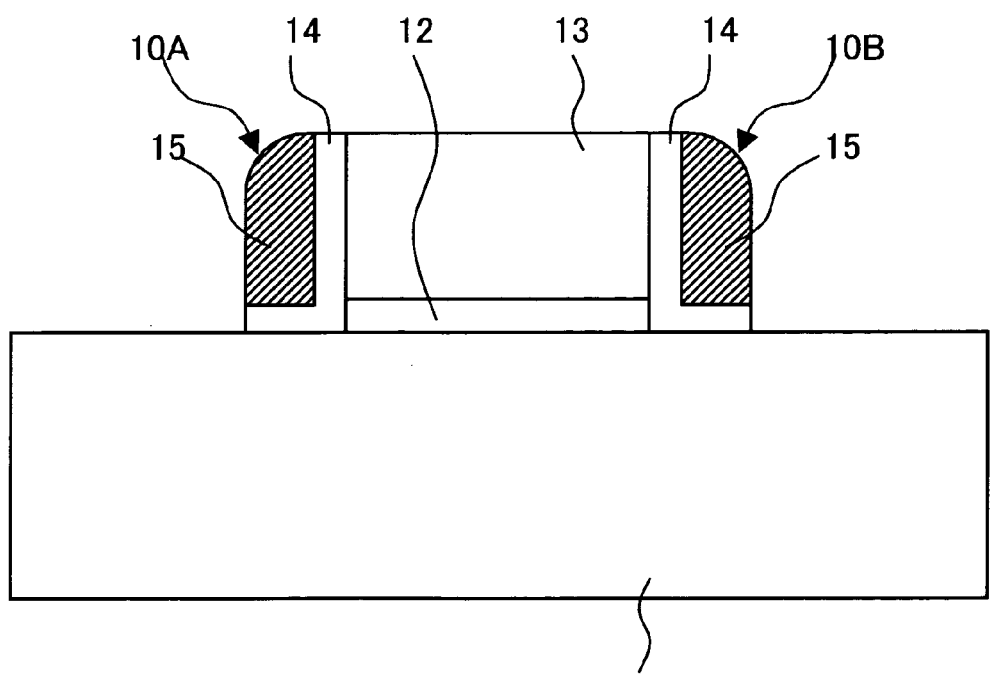
Figure 19F:
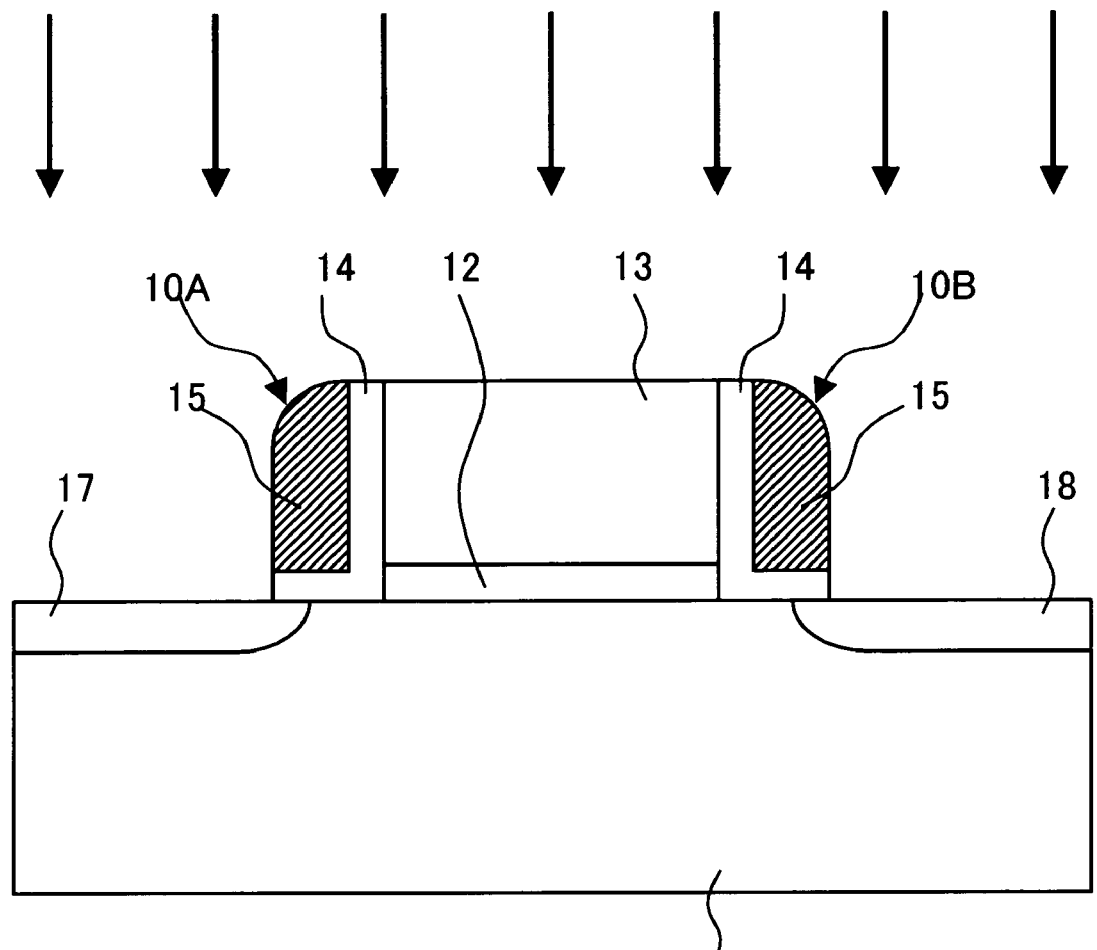
Figure 20:
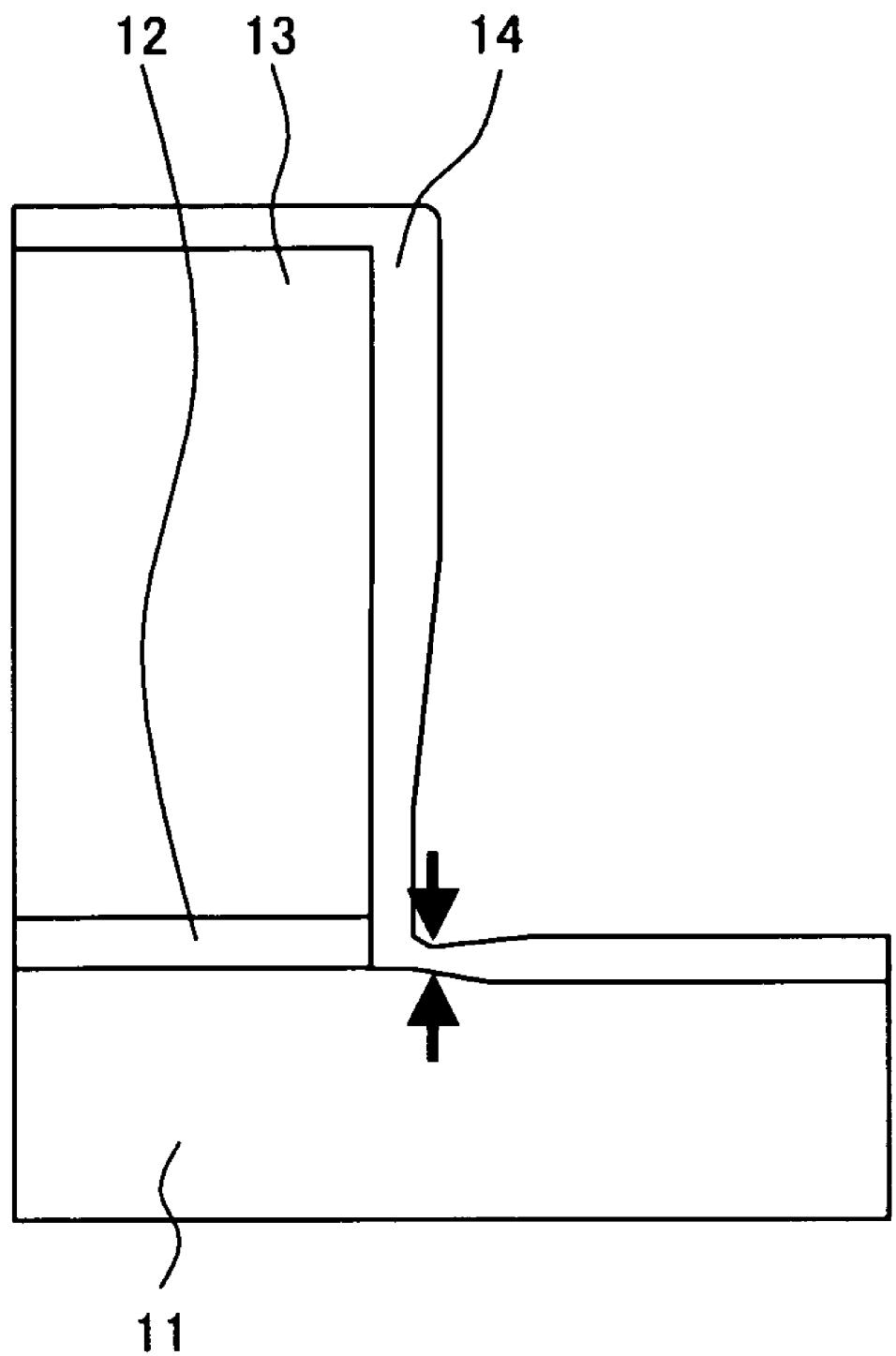
FIG. 20 is an enlarged cross sectional view of the first insulating film in a semiconductor memory device manufactured by the conventional method.

The memory device of this embodiment is more efficient in the programming action than the conventional memory devices shown in FIGS. 16 and 17. Specifically, for example, in the case of the programming action on the charge retention section 20B, as each of the conventional memory devices shown in FIGS. 16 and 17 causes a portion of the electrons accelerated from the pinch-off point to the diffusion area 18 to be deflected upwardly, its charge retention section 10B can thus receive a less amount of the electrons in the programming action. On the contrary, the memory device of this embodiment allows the electrons to be accelerated in the direction denoted by the arrow 32 shown in FIG. 4a and thus received by the silicon nitride film 22 in the charge retention section 20B without significant loss. In other words, since the electrons accelerated from the pinch-off point remain mostly at the large kinetic energy level in the direction denoted by the arrow 32, they can be passed through the silicon oxide film 21 without reduction and thus received at an optimum number by the silicon nitride film 22.

As described, the memory device manufactured by the inventive method of this embodiment is higher in the efficiency of the action and its programming action can significantly be increased in the speed. Since the programming action is improved in the efficiency and speed, it can be lowered in the current to be used. Accordingly, the programming action of the semiconductor memory device can be minimized in the power consumption.

The voltages applied for the programming action on the charge retention section 20B are not limited to those described above in the embodiment but may be modified in which, for example, the diffusion area 17 and the active region 11 are fed with 0 V while the other diffusion area 18 and the gate electrode 13 are fed with +10 V and +5 V respectively. In any case, the charge retention section 20B is charged with hot electrons for the programming action. Also, the voltages applied for the programming action on the charge retention section 20A are not limited to those described above but may be modified by a similar manner.

Second Embodiment

Figure 5A:
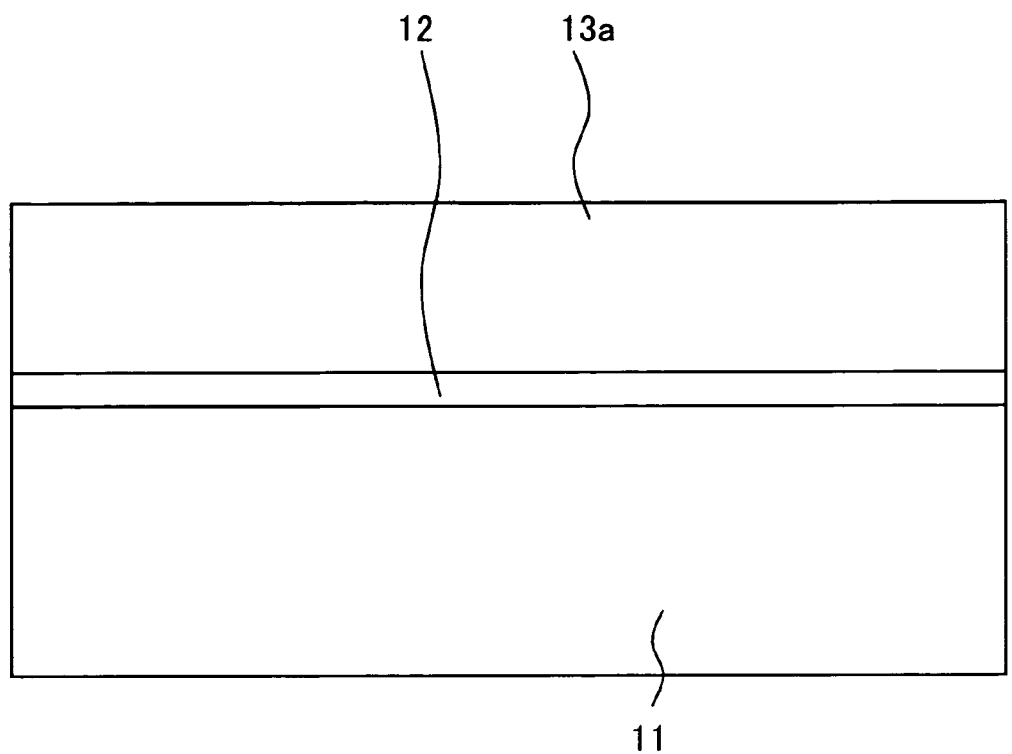
FIG. 5 is a cross sectional view showing steps of the second embodiment of a method of manufacturing a semiconductor memory device according to the present invention.
Figure 5B:
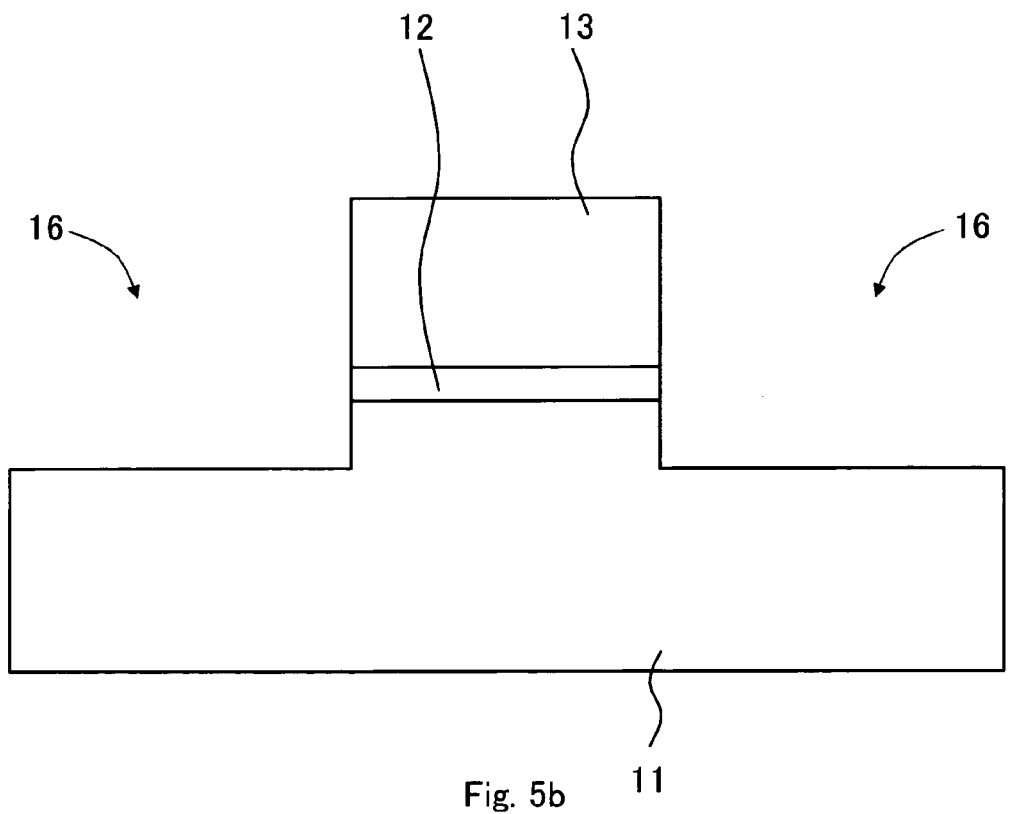

An inventive method of the second embodiment will be described referring to FIGS. 5 and 6. A semiconductor memory device of this embodiment is a modification of the semiconductor memory device of the first embodiment. FIGS. 5 and 6 are cross sectional views showing steps of the inventive method of the second embodiment.

While the charge retention sections 20A and 20B in the first embodiment are arranged of a three-film construction where the second insulating film 22 is sandwiched between the first insulating film 21 and the third insulating film 23, the charge retention sections in this embodiment are arranged of a two-film construction which consists of a first insulating film and a second insulating film. Steps of the inventive method of this embodiment will be explained in more detail. Steps 1 to 3 (shown in FIGS. 5a and 5b) of this embodiment are identical to those of the first embodiment and their explanation will be omitted.

Figure 5C:
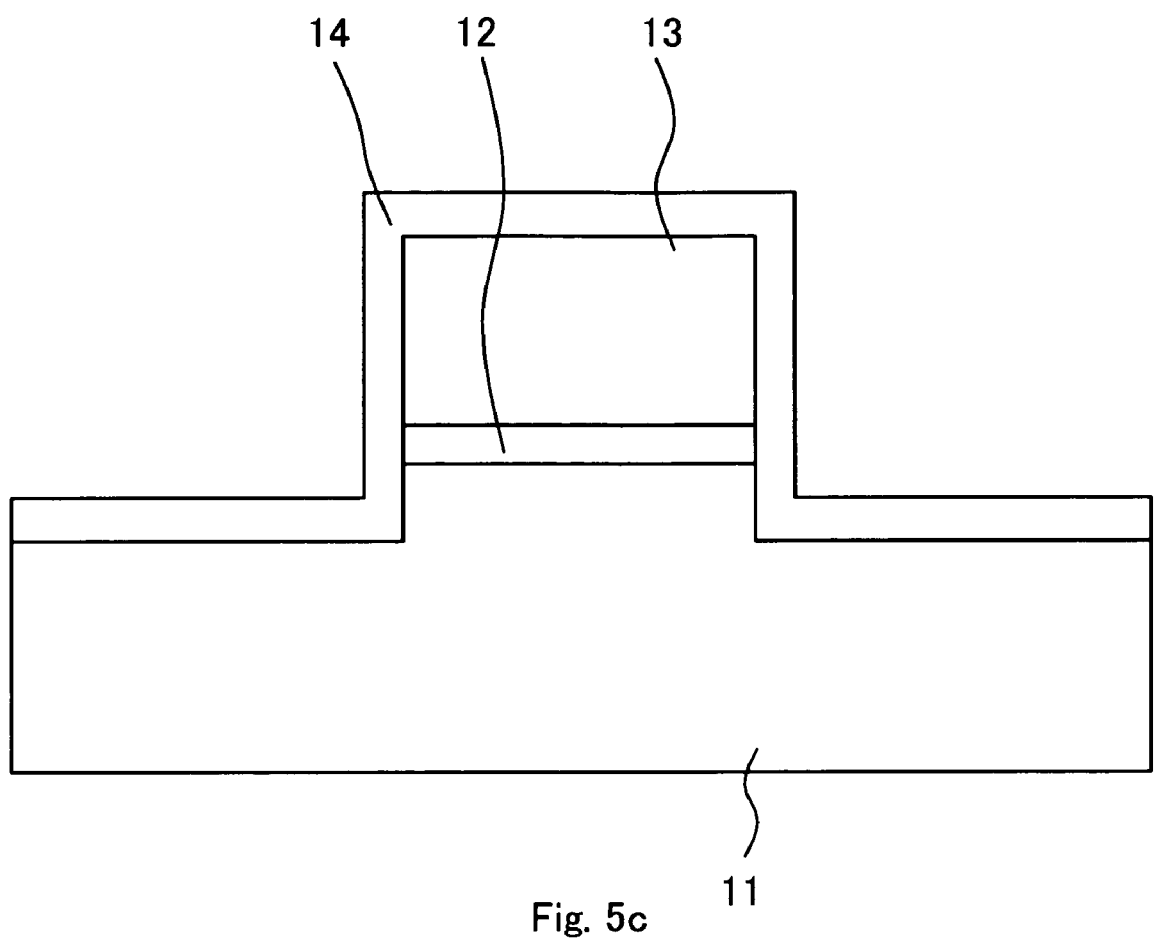
Figure 6D:
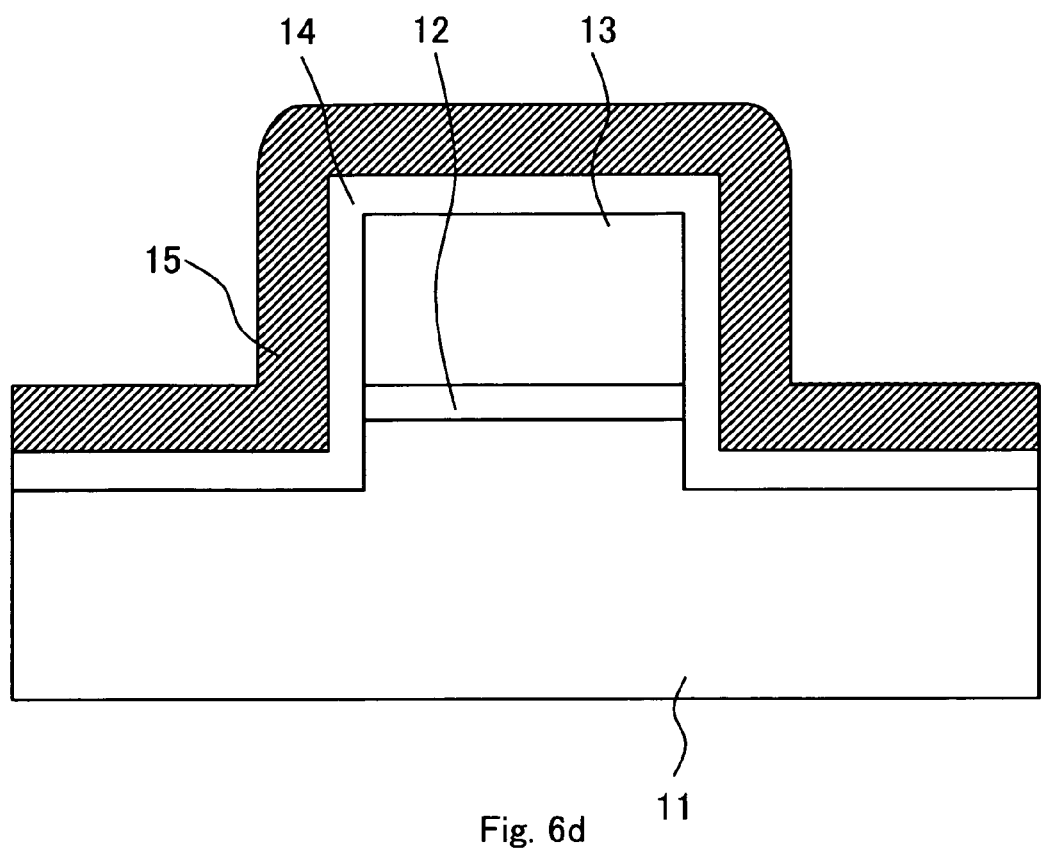
FIG. 6 is a cross sectional view showing steps of the second embodiment of the method of manufacturing a semiconductor memory device according to the present invention.

In this embodiment, when the opening 16 has been provided at the third step, the first insulating film 14 is provided to cover the side and bottom surface of the opening 16 as shown in FIG. 5c (as Step 4). More particularly, the first insulating film 14 is provided as a part of the charge retention section in the form of, e.g., a silicon oxide film produced by an oxidizing action in a diffusion furnace. Then, as shown in FIG. 6d, e.g., a silicon nitride film is deposited as the second insulating film 15 on the first insulating film 14 by a CVD method (as Step 5).

Figure 6E:
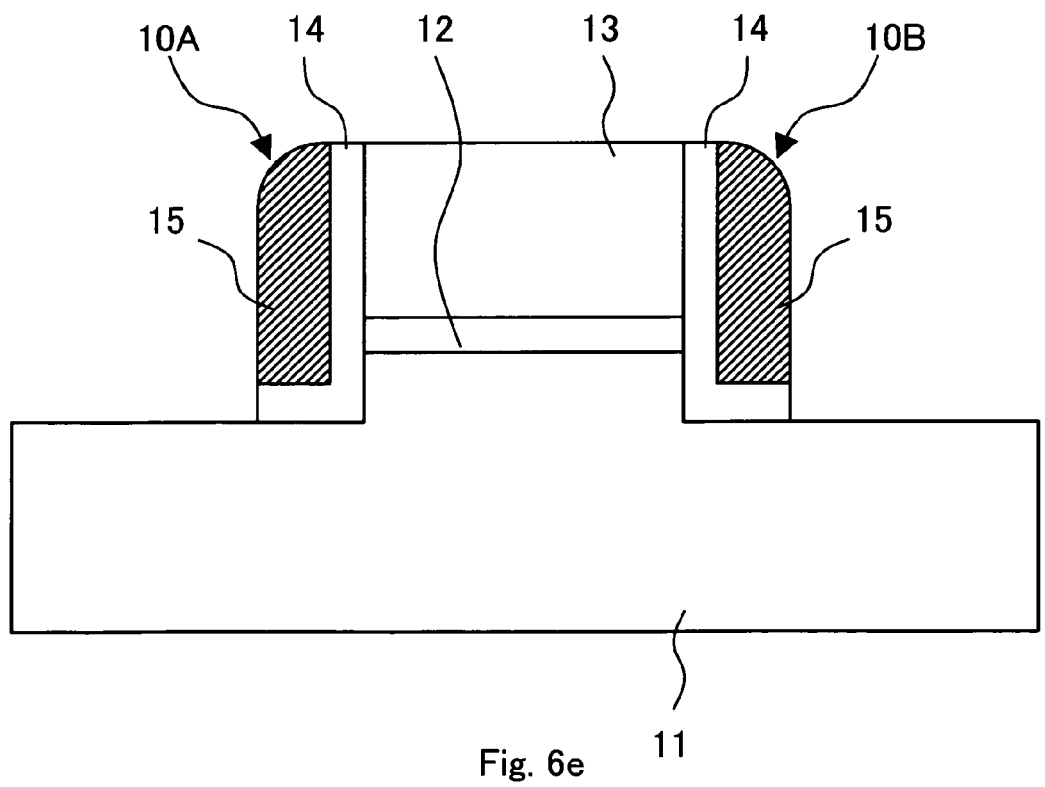
Figure 6F:
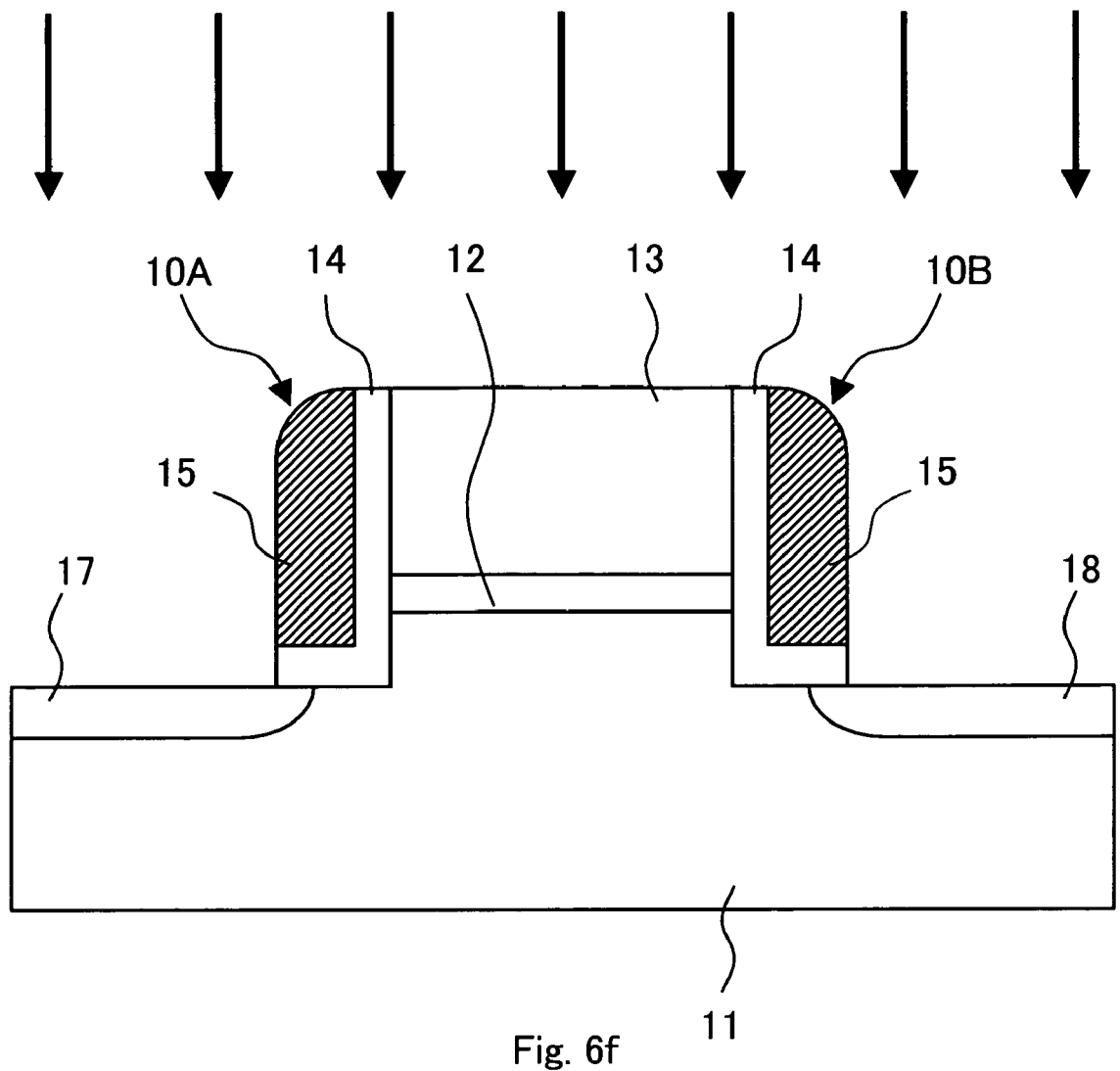

This is followed by etching the first insulating film 14 and the second insulating film 15 by an RIE process to develop a couple of charge retention sections 10A and 10B of a side wall spacer shape at both sides of the gate insulating film 12 and the gate electrode 13 at the opening 16 as shown in FIG. 6e (as Step 6). Then, two diffusion areas 17 and 18 of the second conduction type which is different from the first conduction type are provided at a position opposite to the gate electrode 13 beneath the charge retention sections 10A and 10B in the active region 11 as shown in FIG. 6f (as Step 7).

Third Embodiment

Figure 7A:
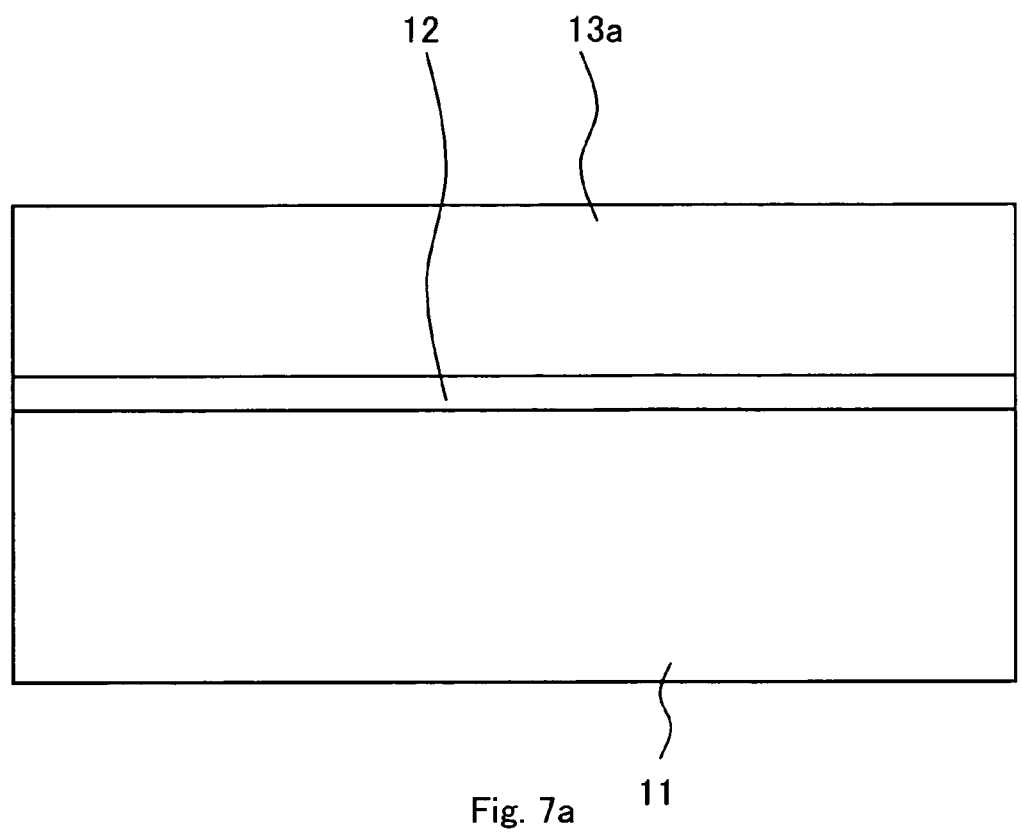
FIG. 7 is a cross sectional view showing steps of the third embodiment of a method of manufacturing a semiconductor memory device according to the present invention.
Figure 7B:
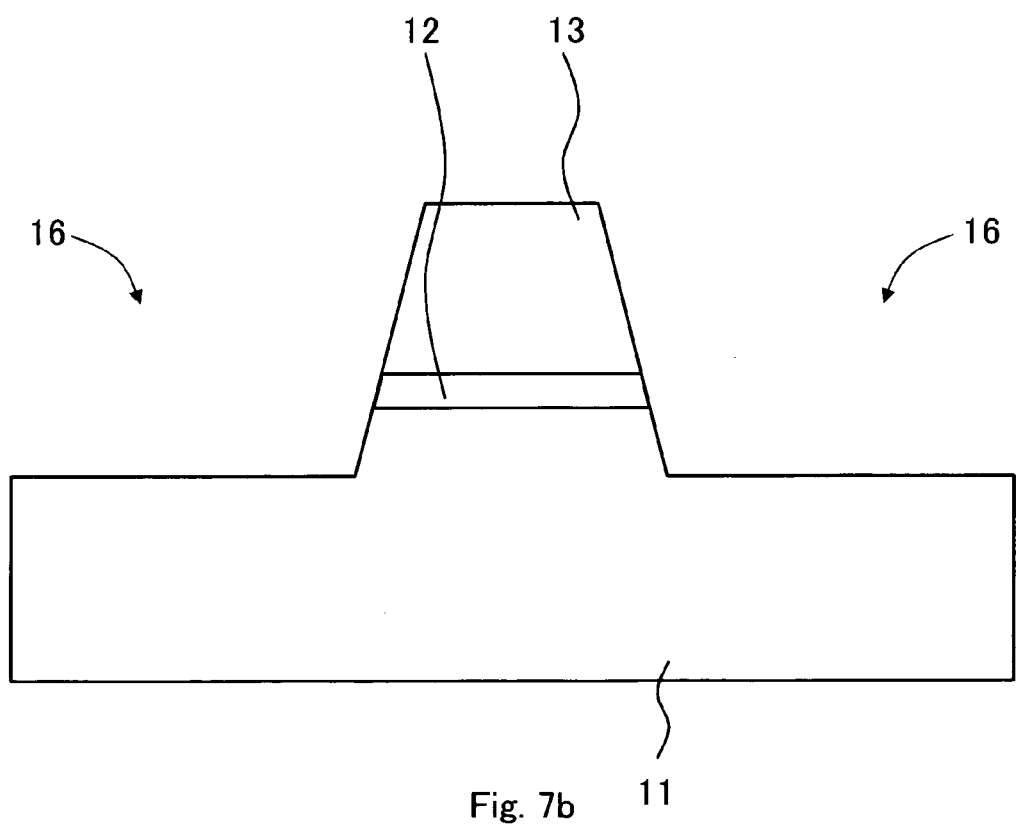

An inventive method of the third embodiment will be described referring FIGS. 7 and 8. This embodiment is differentiated from the first and second embodiments by the fact the gate electrode in the memory device is modified in the shape.

In particular, the side wall of the opening 16 in the memory device of this embodiment is arranged to a tilted form which becomes further distanced from the gate electrode 13 as being close to the bottom of the opening 16 by the action of Step 3. More specifically, as shown in FIG. 7b, the side wall of the opening 16 is arranged of a tilted or direct taper form produced by RIE etching. Step 1, Step 2, and Steps 4 to 7 are identical to those of the second embodiment and will be explained in no more detail.

In this embodiment, as the gate electrode 13, the gate insulating film 12, and the active region 11 are etched by the RIE process of Step 3, they are shaped to the direct taper form shown in FIG. 7b. This shape can be implemented depending on the conditions of the RIE process.

In fact, the trapezoid (direct taper) shape in the cross section of the gate electrode 13, the gate insulating film 12, and the active region 11 may be implemented by changing the flow of RIE gas. More specifically, the flow of the etching gas is controlled so as to produce a more deposition, such as oxygen $O_2$ for oxidizing poly silicon as an example of the gate electrode 13 and HBr gas for generating an etch protecting film of Br over the oxide film. As the deposition is increased, the mesa of the gate electrode 13, the gate insulating film 12, and the active region 11 (at the side wall exposed to the opening 16 beneath the gate insulating film 12) is protected at both sides from the lateral etching and can thus be arranged of a trapezoid and direct taper shape in the cross section.

Figure 7C:
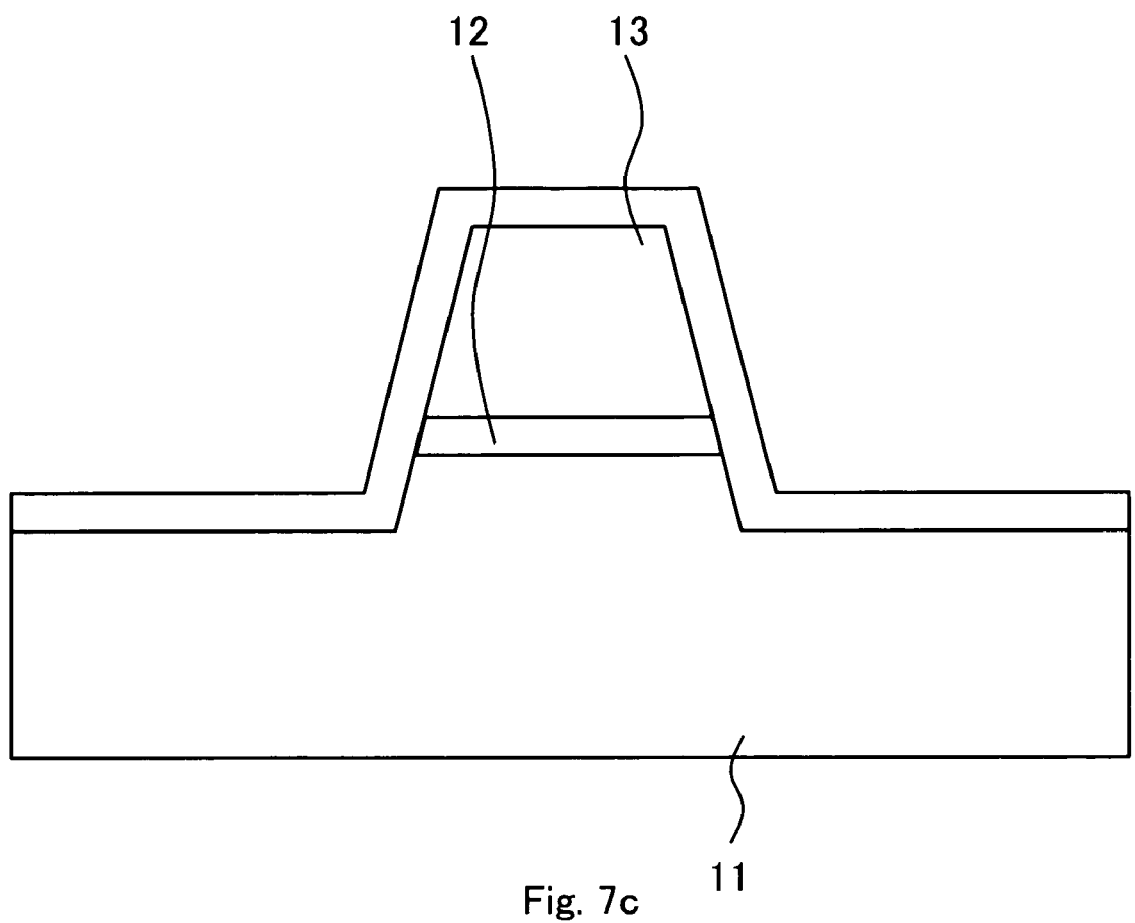
Figure 8D:
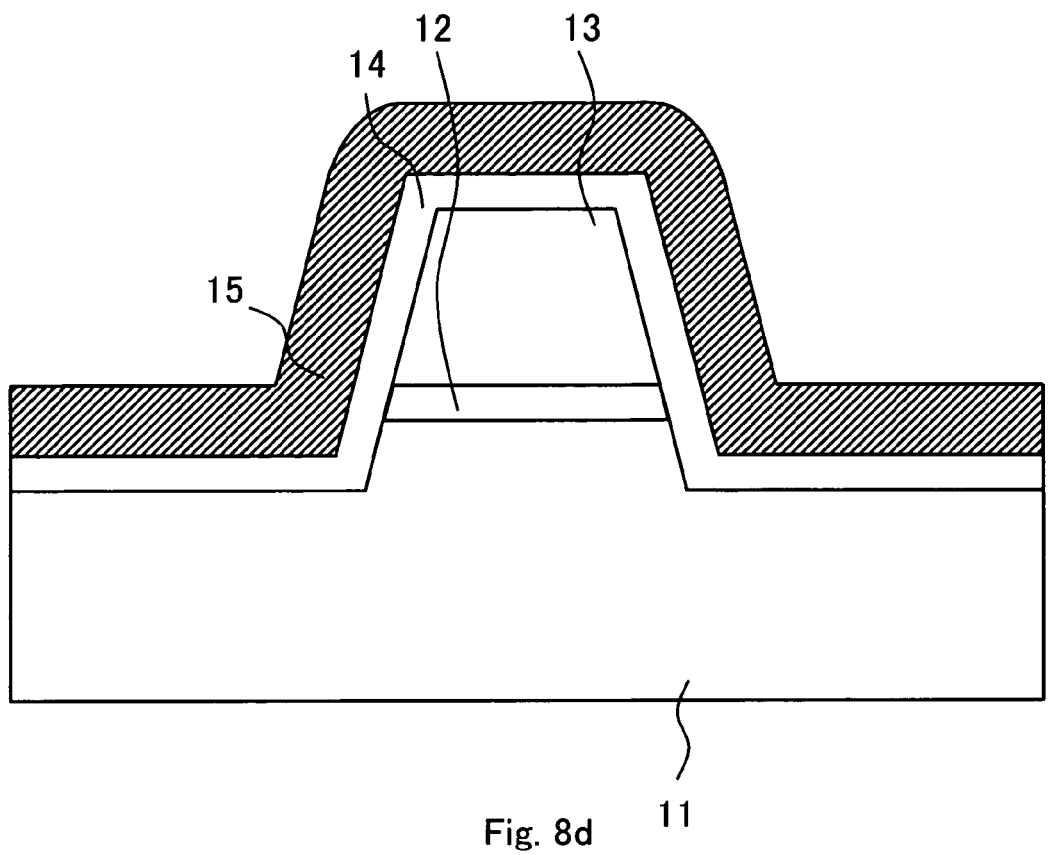
FIG. 8 is a cross sectional view showing steps of the third embodiment of the method of manufacturing a semiconductor memory device according to the present invention.
Figure 8E:
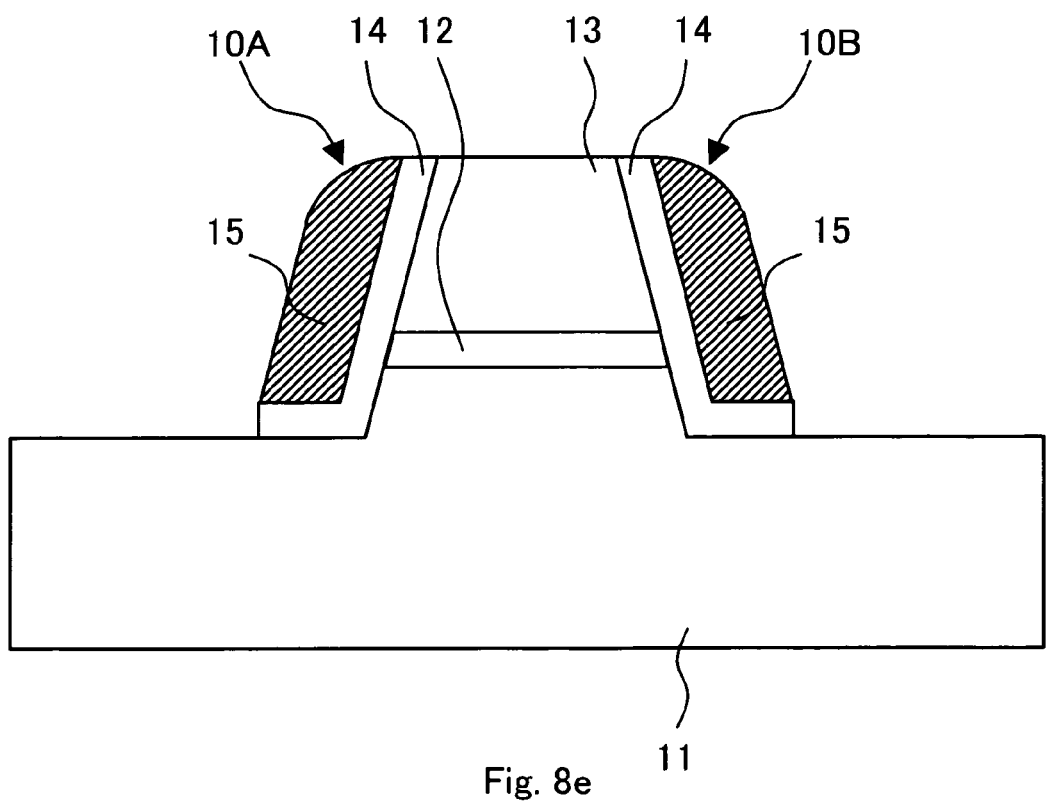
Figure 8F:
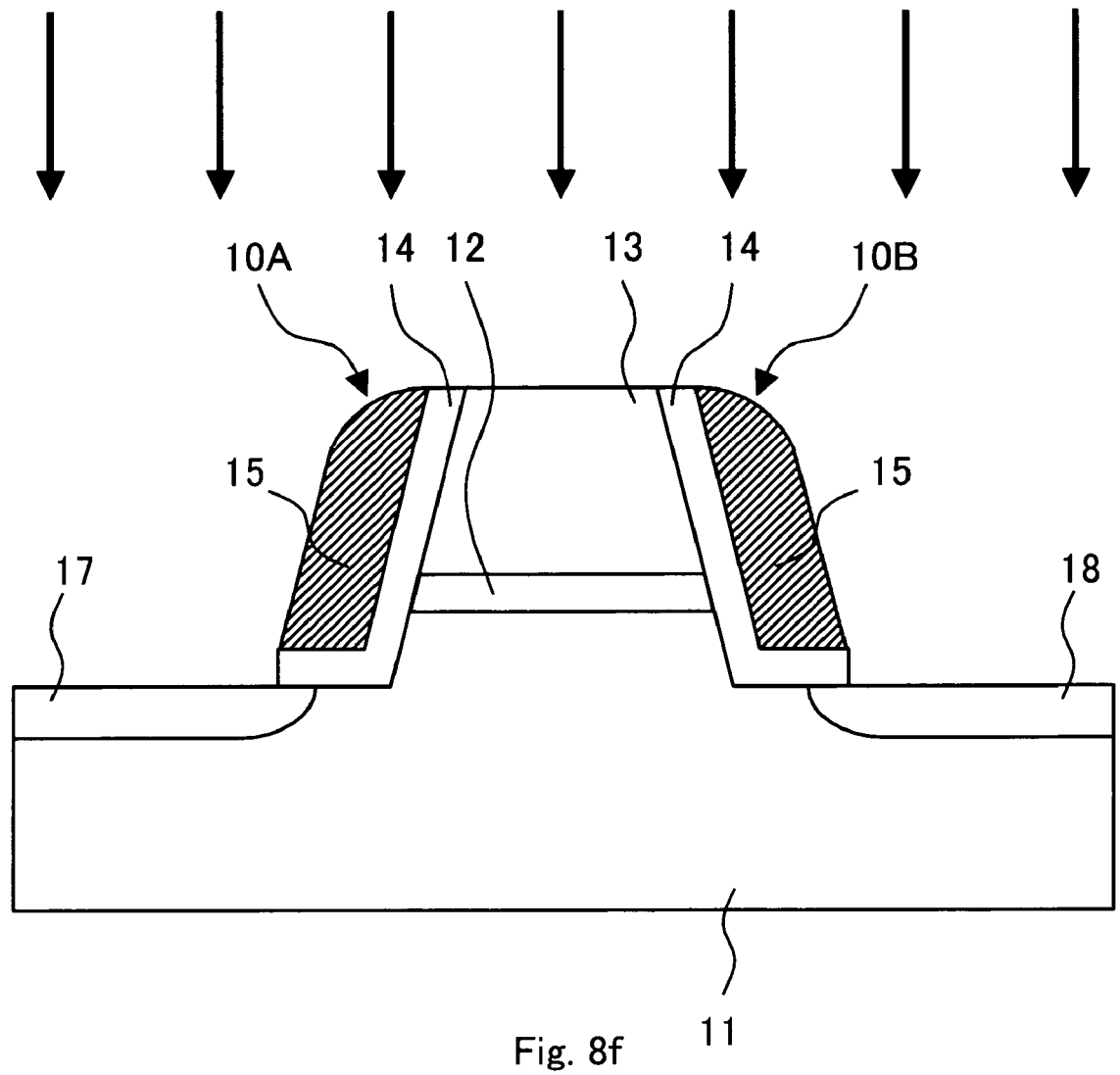

In this embodiment, the direct taper shape of the gate electrode 13 permits the oxidizing gas to be applied adjacent to the lowermost of the gate electrode 13 at the bottom of the opening 16 to be increased, thus producing a uniform thickness of the first insulating film 14, as shown in FIG. 7c. As the result, the first insulating film 14 will be improved in the uniformity.

Fourth Embodiment

An inventive method of the fourth embodiment will be described. In this embodiment, the same direct taper shape at the opening 16 as of the third embodiment is formed in different ways. Step 1, Step 2, and Steps 4 to 7 are identical to those of the third embodiment and will be explained in no more detail.

Step 3 of this embodiment involves modifying the pressure of the etching process for producing the direct taper shape in the cross section of the gate electrode 13, the gate insulating film 12, and the active region 11. More specifically, as the pressure is decreased, the deposition will be etched with more difficulty. As the result, the mesa of the gate electrode 13, the gate insulating film 12, and the active region 11 (at the side wall exposed to the opening 16 beneath the gate insulating film 12) can be etched to the direct taper shape in the cross section.

Fifth Embodiment

An inventive method of the fifth embodiment will be described. The direct taper shape in the cross section at the opening 16 similar to those of the third and fourth embodiments is fabricated by a different manner. Step 1, Step 2, and Steps 4 to 7 are identical to those of the third and fourth embodiments and will be explained in no more detail.

Step 3 in this embodiment is modified in which the straight advancement of ions for the etching is lowered to fabricate the direct shape in the cross section of the gate electrode 13, the gate insulating film 12, and the active region 11. More particularly, as the ions produced by the generation of plasma are thrown by the action of electric field against the surface of the semiconductor substrate for promoting the reaction between the ions and the material of the semiconductor substrate for the etching, their straight advancement is lowered by decreasing the strength of the electric field thus to shift from anisotropy to isotropy. As the result, the mesa of the gate electrode 13, the gate insulating film 12, and the active region 11 (at the side wall exposed to the opening 16 beneath the gate insulating film 12) can be etched to the direct taper shape in the cross section.

Sixth Embodiment

Figure 9A:
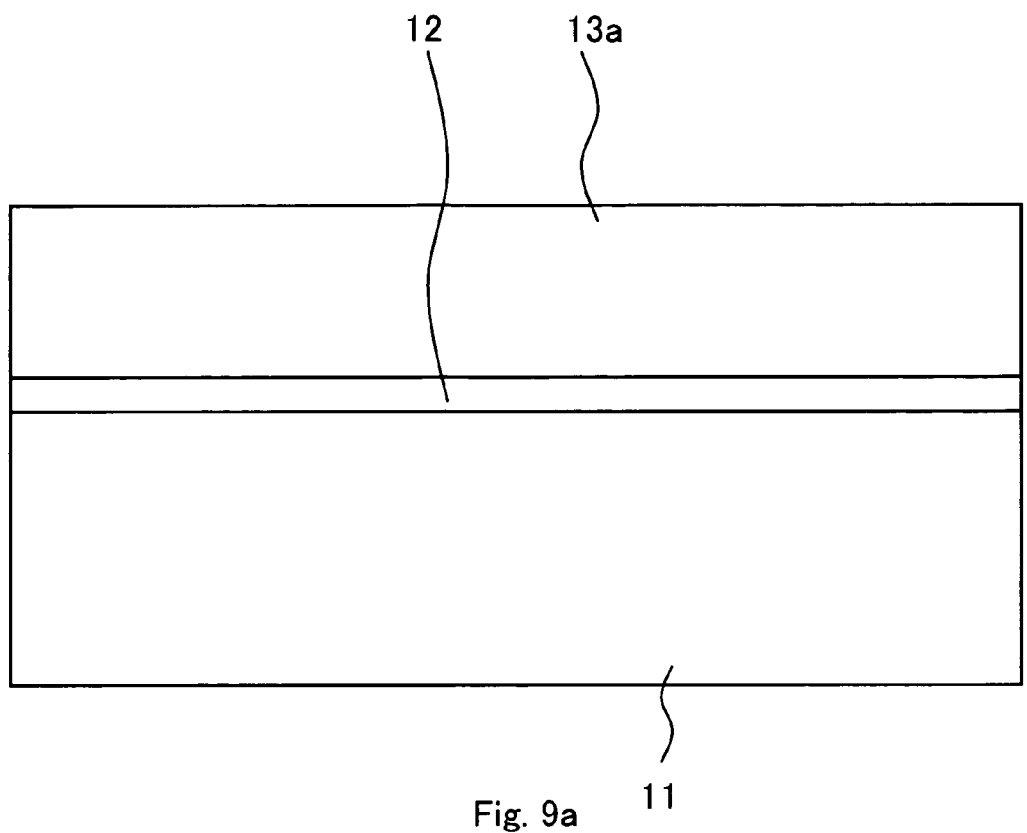
FIG. 9 is a cross sectional view showing steps of the sixth embodiment of a method of manufacturing a semiconductor memory device according to the present invention.

An inventive method of the sixth embodiment will be described referring to FIGS. 9 and 10. This embodiment is differentiated from the foregoing embodiments by the fact that the gate electrode in the memory device is modified in the cross sectional shape. Steps 1, Step 2, and Steps 4 to 7 are identical to those of the third to fifth embodiments and will be explained in no more detail.

Figure 9B:
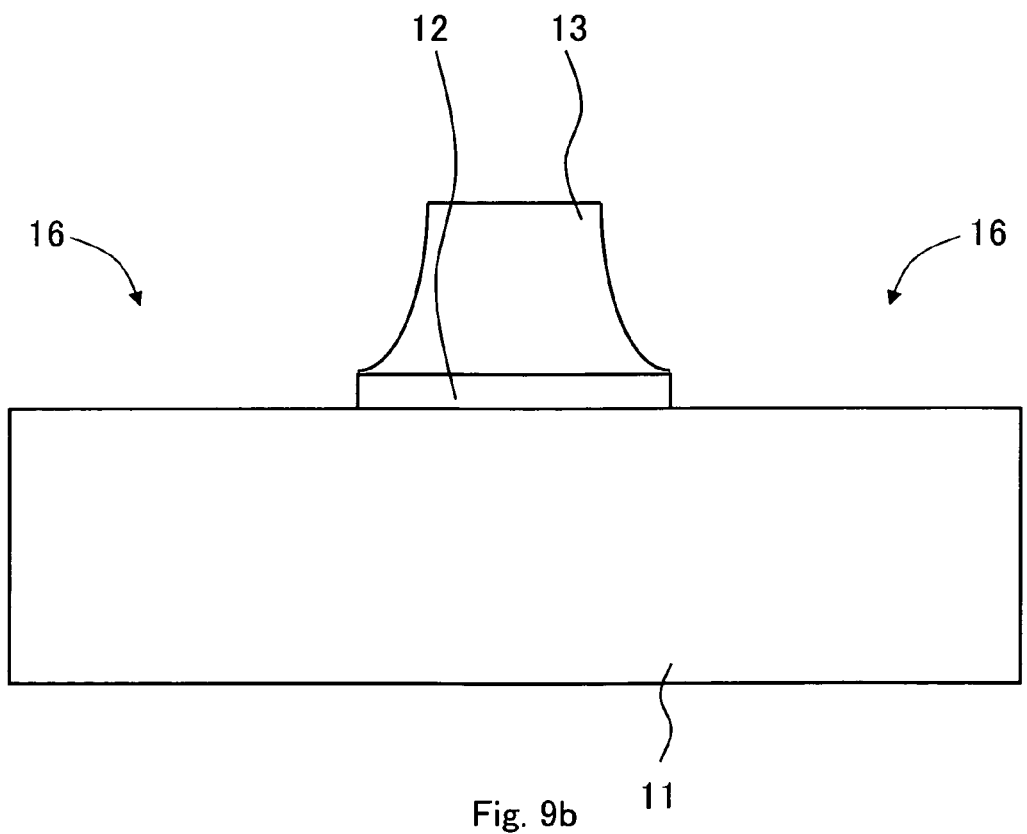
Figure 9C:
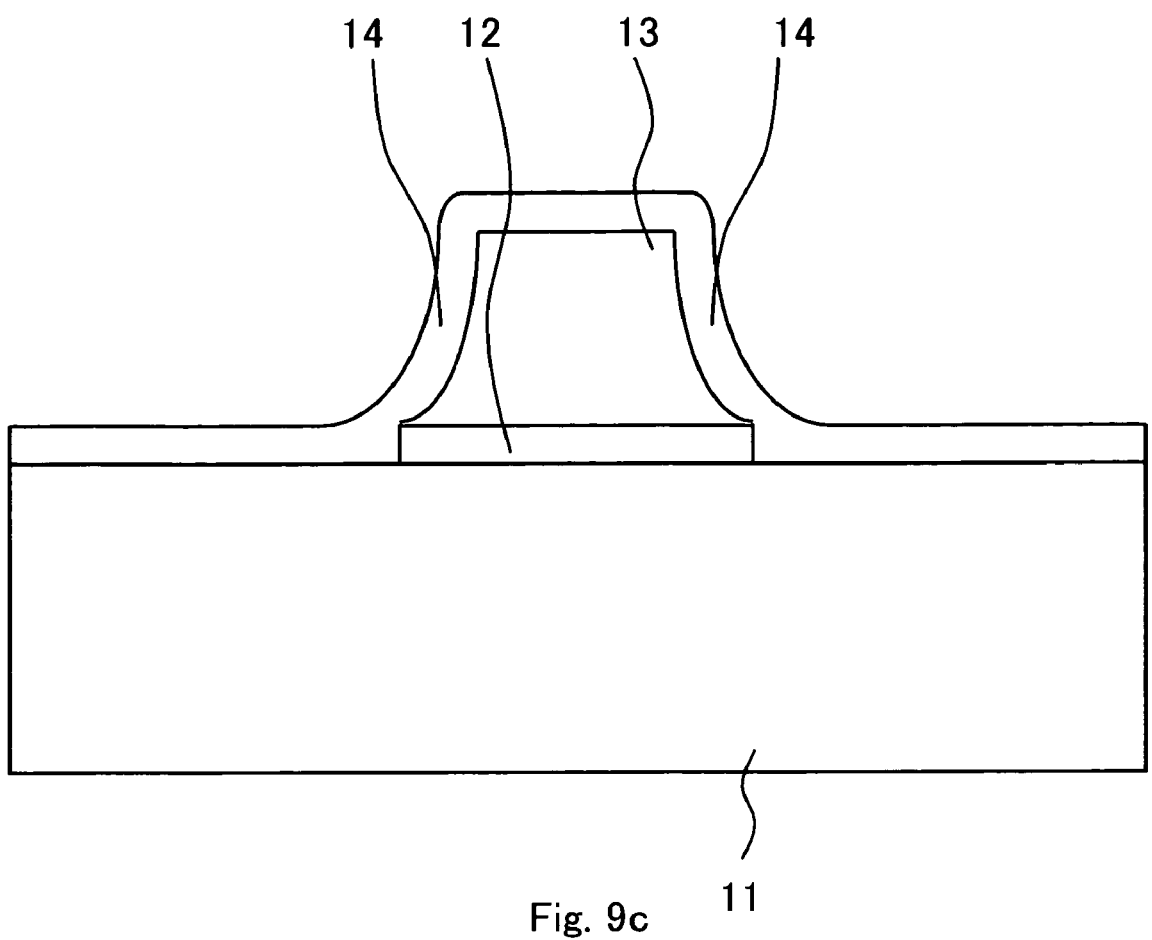
Figure 10D:
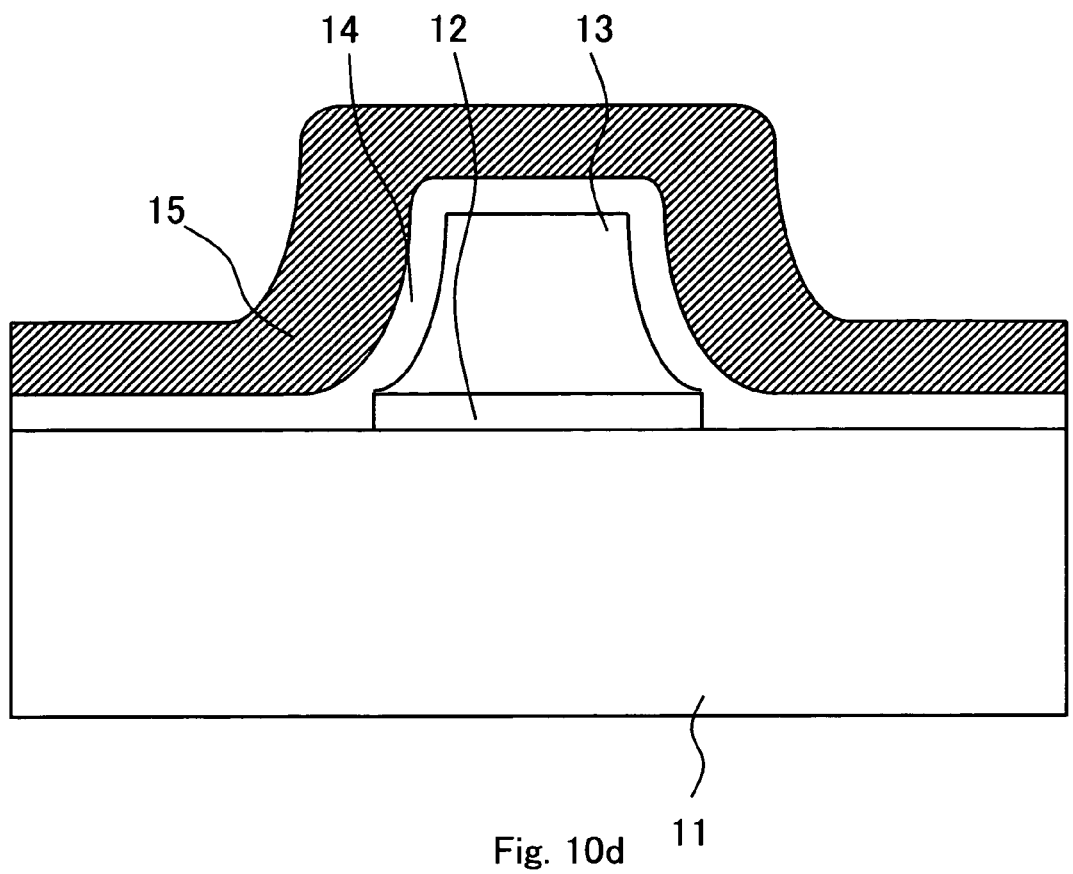
FIG. 10 is a cross sectional view showing steps of the sixth embodiment of the method of manufacturing a semiconductor memory device according to the present invention.
Figure 10E:
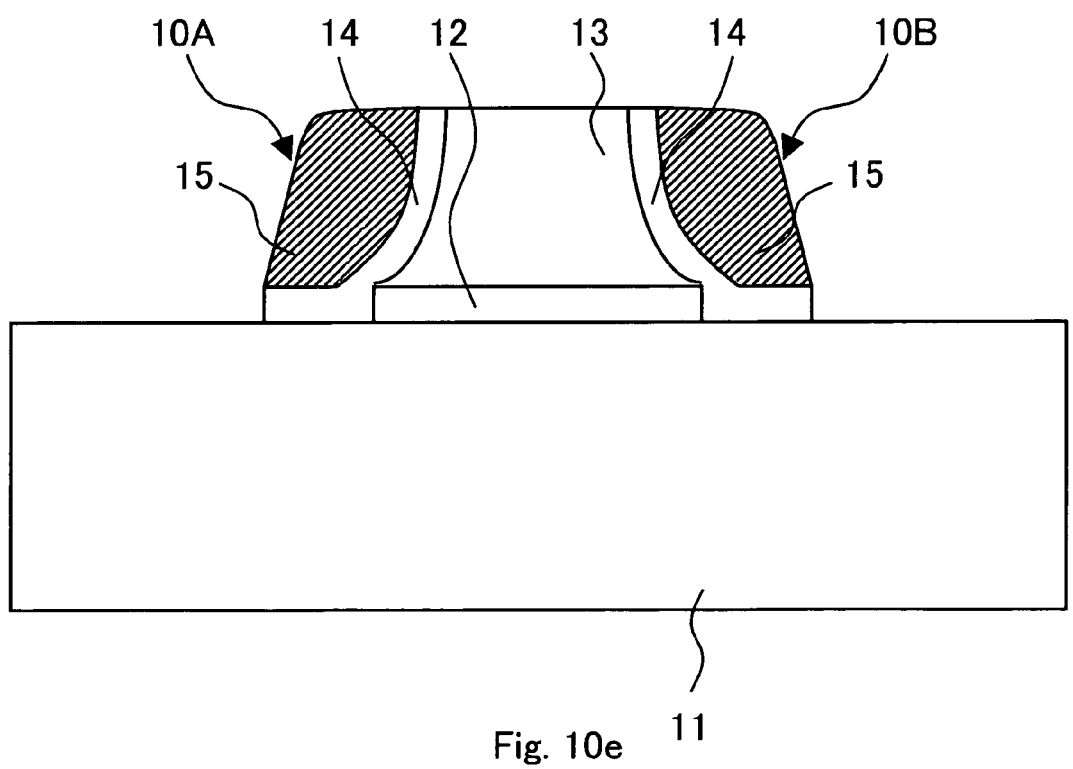
Figure 10F:
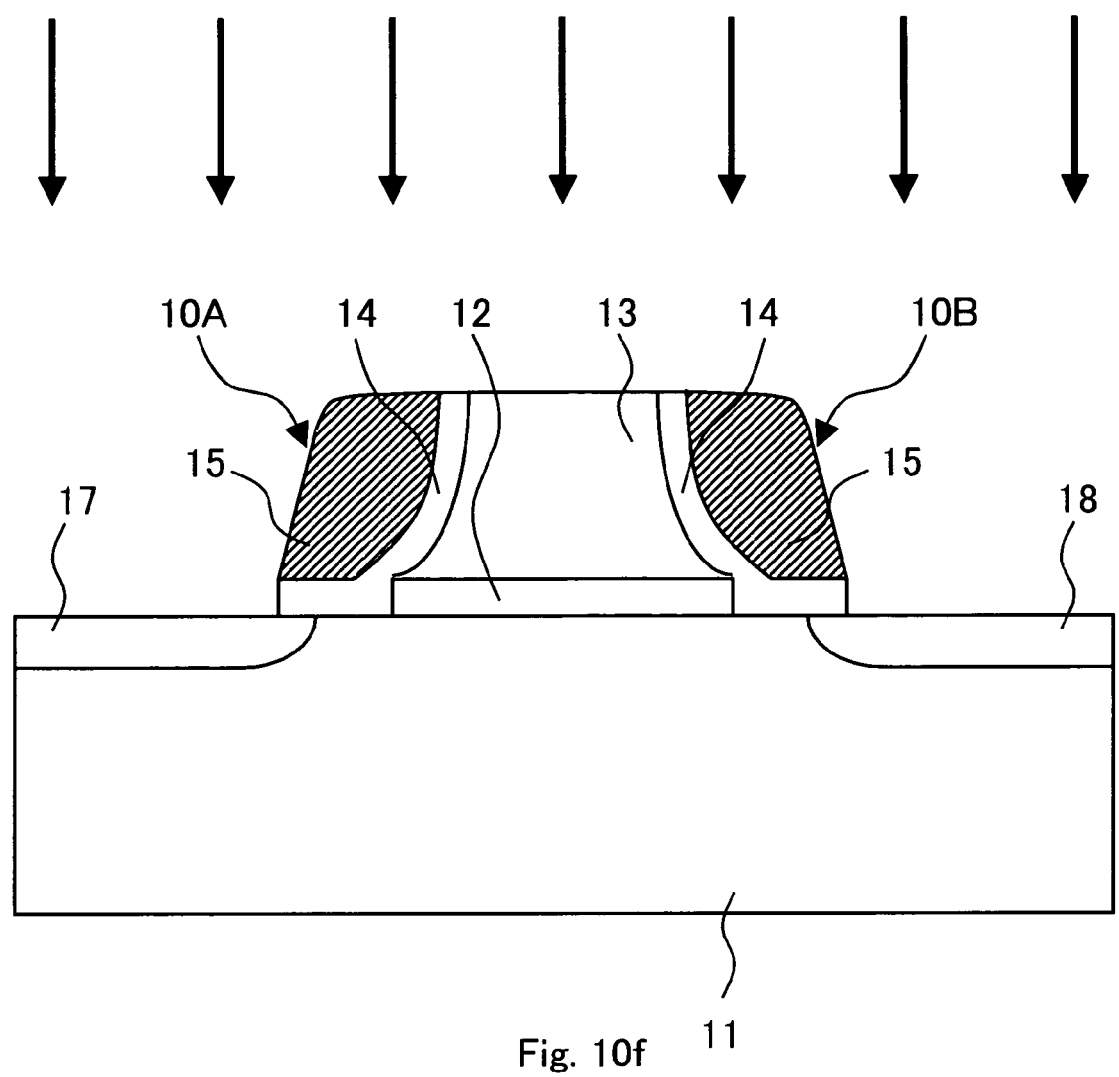

Step 3 of this embodiment unlike the third to fifth embodiments for etching the first conductive film 13a using an RIE process is modified in which the side wall at the opening 16 is shaped to an arcuate concave in the gate electrode 13 as shown in FIG. 9b. Particularly, this embodiment unlike the third to fifth embodiments permits the active region 11 to remain not etched as shown in FIGS. 9 and 10.

More particularly, Step 3 of the inventive method of the sixth embodiment unlike the third to fifth embodiments divides the action, shown in FIG. 9b, of RIE etching the gate electrode 13 and the gate insulating film 12 into sub steps. The sub steps are conditioned so that as the etching proceeds, the angle of the side wall to the bottom of the opening 16 is increased or the angle of direct taper is sharpened. As the result, the direct taper rounded form at the opening 16 (in the cross section at the side wall of the gate electrode 13) can be fabricated. The etching action may be divided into two or more sub steps. The more the number of the sub steps, the smoother the side wall will be shaped arcuately. Preferably, the number of the sub steps ranges from two to ten. Since the side wall of the direct taper form in the cross section of the gate electrode 13 is arranged of an arcuate concave, the flow of oxidizing gas for the etching can be increased towards the lower end of the gate electrode 13, thus ensuring an uniform thickness of the first insulating film 14.

Although the active region 11 in this embodiment remains not etched down, the etching of the gate electrode 13 at Step 3 may be conducted down to the gate insulating film 12 and the active region 11 as well as the gate electrode 13 similar to that of the first or second embodiment. In the latter case, the same advantageous effect as of the first and second embodiments can be obtained.

Seventh Embodiment

An inventive method of the seventh embodiment will be described referring to FIGS. 11 to 13. This embodiment is differentiated from the first and second embodiments by the fact that the action at Step 3 for providing the opening 16 is modified. Step 1, Step 2, and Steps 4 to 7 are identical to those of the third to fifth embodiments and will be explained in no more detail.

Figure 12C:
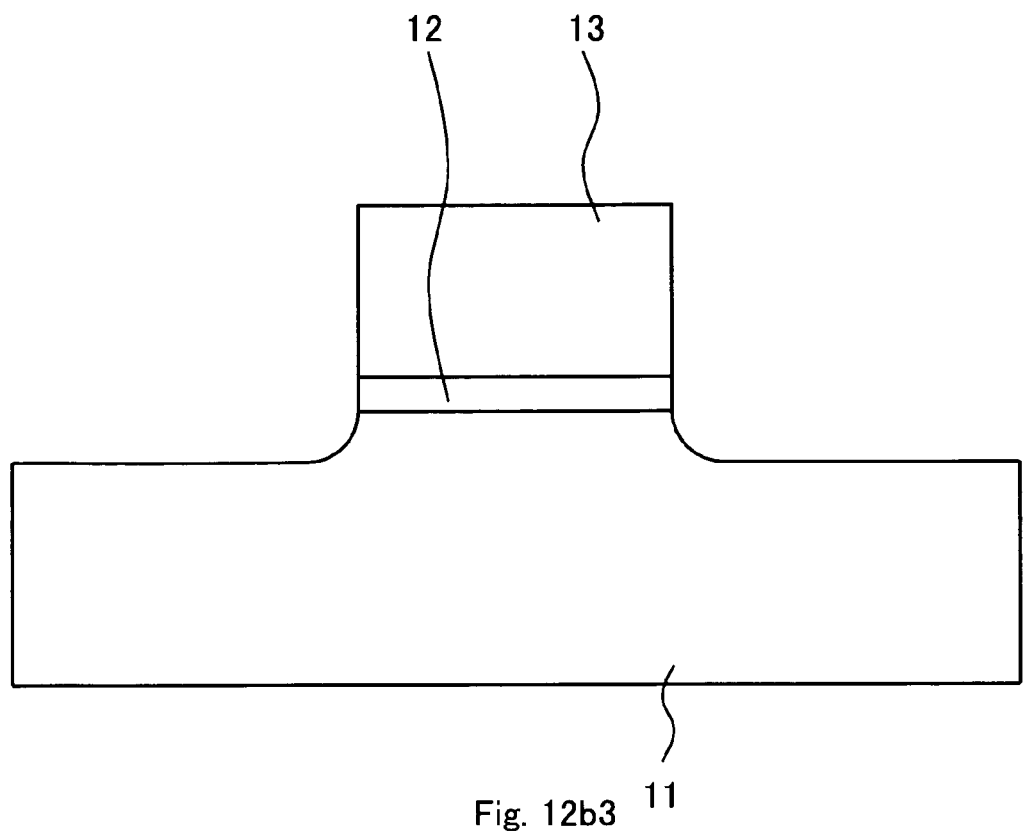
FIG. 12 is a cross sectional view showing steps of the seventh embodiment of the method of manufacturing a semiconductor memory device according to the present invention.
Figure 12C:
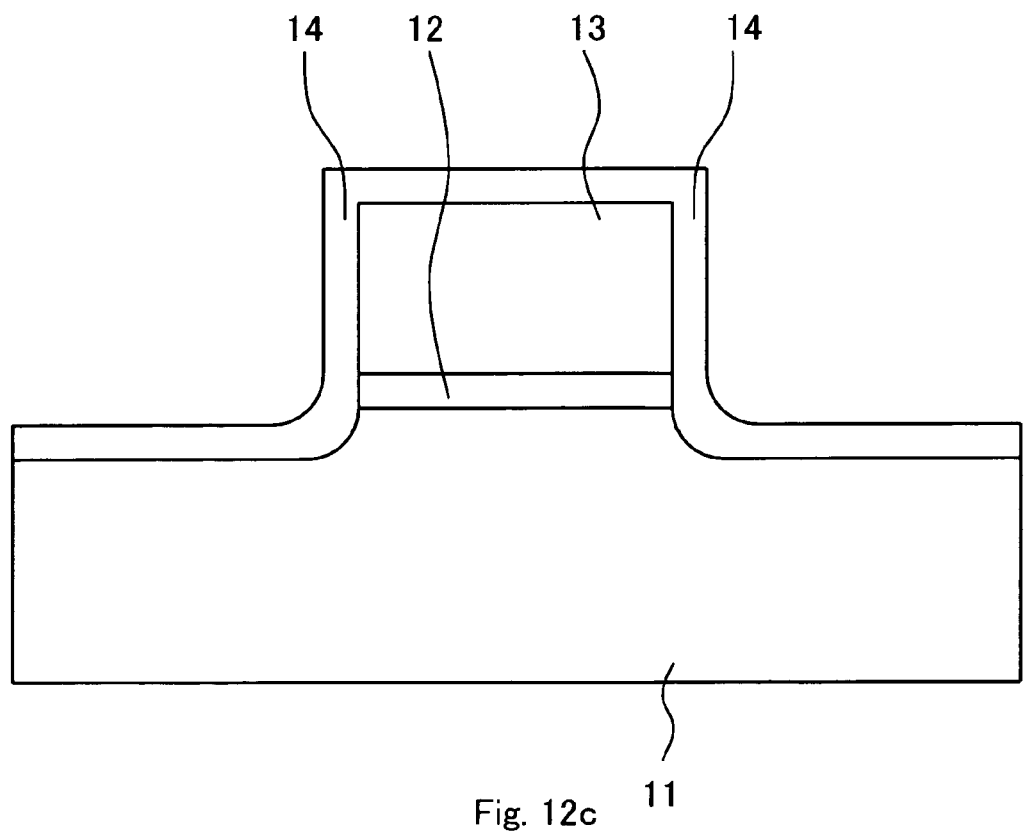
Figure 12D:
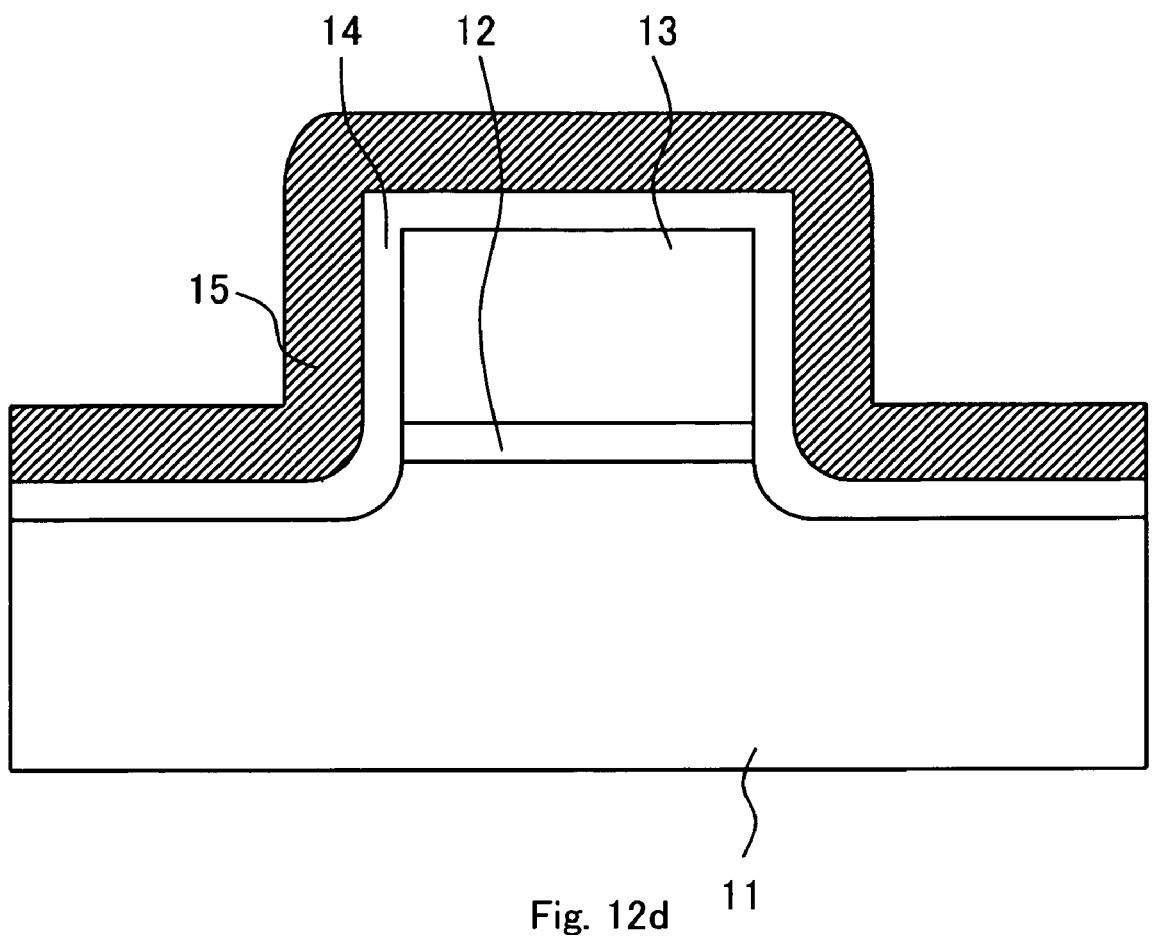
Figure 13E:
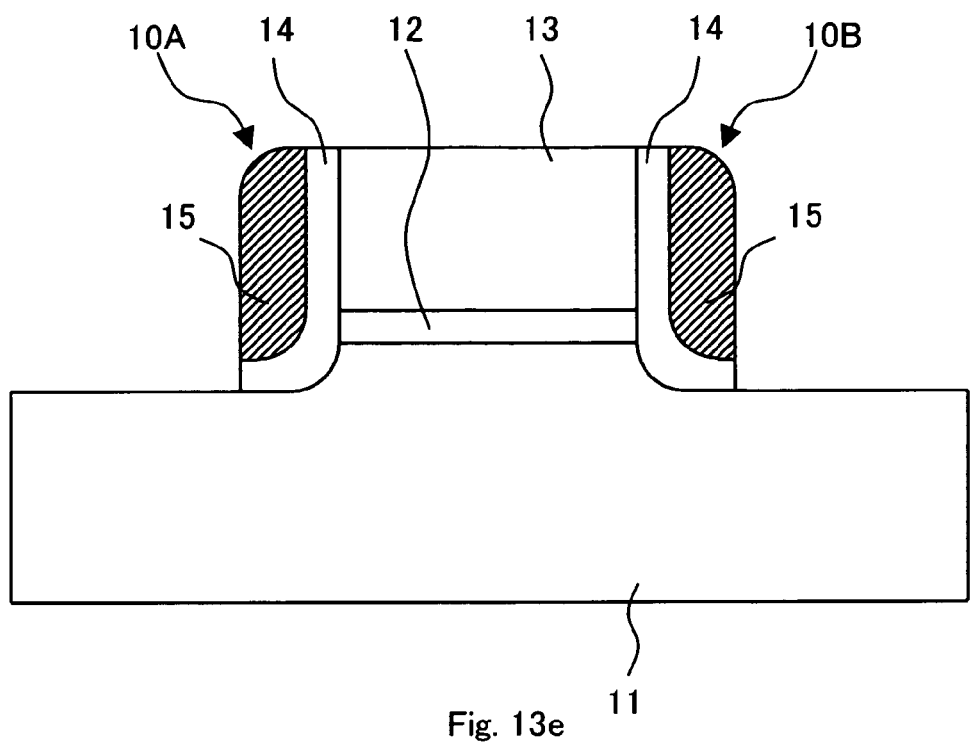
FIG. 13 is a cross sectional view showing steps of the seventh embodiment of the method of manufacturing a semiconductor memory device according to the present invention.
Figure 13F:
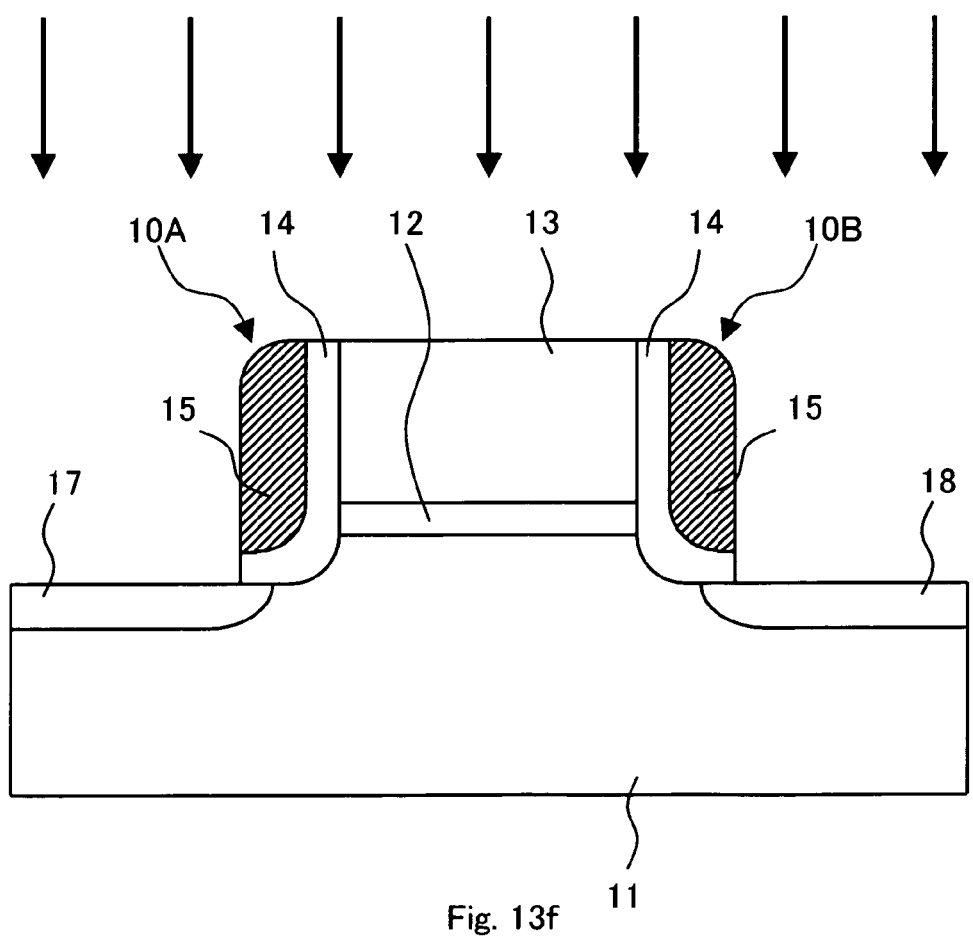

In this embodiment, after the action of etching the gate electrode 13 and the gate insulating film 12, an oxide film is provided and removed as shown in FIGS. 11 to 13 thus to recess the active region 11 or shape the opening 16 of which the bottom is located lower than the interface between the gate insulating film 12 and the active region 11.

More specifically, the opening 16 is provided by patterning and etching the gate electrode 13 and the gate insulating film 12 at Step 3 shown in FIG. 11$b$1. Then, as shown in FIG. 11$b$2, a fourth insulating film 19 is provided to extend over the side and bottom surface of the opening 16. More particularly, e.g., a silicon oxide film 19 is provided as the fourth insulating film by oxidizing the surface of the active region 11. The thickness of the silicon oxide film 19 is set to a range from 2 nm to 100 nm or preferably from 4 nm to 30 nm. This protects the gate electrode 13 from oxidization during the forming of the silicon oxide film 19 in case that both the active region 11 and the gate electrode 13 are made of poly silicon. Then, as shown in FIG. 12$b$3, the silicon oxide film 19 is removed by an isotropic etching or any other applicable technique. As the result, the active region 11 is recessed and the side wall of the opening 16 beneath the lower side of the gate insulating film 12 is arranged to a rounded tilted form which becomes further distanced from the gate electrode 13 as being closer to the bottom of the opening 16.

Since the side wall at the opening 16 is oxidized and the resultant silicon oxide film is removed for recessing the active region 11 at Step 3, the flow of oxidizing gas for the etching can be increased adjacent to the lower end of the gate electrode 13. This allows the first insulating film 14 to be made uniform in the thickness at Step 4.

Other Embodiments (1) The charge retention sections are not limited to the constructions 20A, 20B, 10A, 10B in the first and second embodiments. For example, the charge retention sections may contain quantum dots of a nanometer size having the function of retaining charges. Also, the charge retention sections are not limited to a side wall spacer shape but may be located at both sides of the gate electrode while remaining partially in direct contact with the active region and the source/drain region. When the charge retention sections are arranged of a side wall spacer shape, they can be fabricated by a known self-alignment processing technique used for the gate electrode side wall spacer of a common transistor structure. In the latter case, the gate electrode side wall common to a logic transistor and a memory transistor can contribute to the development of a logic memory installed LSI.

(2) Although the action at Step 3 of each of the third to fifth embodiments involves etching the gate electrode 13, the gate insulating film 12, and the active region 11 to form the direct taper shape in the cross section, the first insulating film 14 may be provided to substantially a uniform thickness by not etching the active region 11. The thickness of the first insulating film 14 will be more uniform when the etching is advanced into the active region 11 for providing the direct taper shape at the opening 16 (particularly of the gate electrode 13).

(3) Although the direct taper shape in the cross section is formed by the action at Step 3 of each of the third to fifth embodiments of etching the gate electrode 13, the gate insulating film 12, and the active region 11, it may be embodied only the opening 16 beneath the lower side of the gate insulating film 12. This will also ensure a uniform thickness of the first insulating film 14.

(4) Although the charge retention sections 10A and 10B are composed of the first insulating film 14 and the second insulating film 15 in each of the third to seventh embodiments similar to those of the second embodiment, they may be composed of three, first to third, insulating films similar to those of the first embodiment. More specifically, the silicon nitride film 22 as the second insulating film for trapping electrons is sandwiched between the silicon oxide film 21 as the first insulating film and the silicon oxide film 23 as the third insulating film.

(5) Although the foregoing embodiments are depicted for manufacturing a memory device for memory of a two-bit data in its charge retention section, their inventive method may, with equal success, manufacture a memory device for memory of four-bit data or more-bit data.

(6) The semiconductor substrate in the semiconductor memory device manufactured by the inventive method of each of the embodiments is of no limitations so long as being used as a component of the semiconductor memory device. The semiconductor substrate may be made of an element semiconductor such as silicon or germanium or a compound semiconductor such as GaAs, InGaAs, or ZnSe or may be arranged of any other semiconductor substrate construction such as SOI or multi-film SOI or semiconductor films deposited over a glass or plastic substrate. Preferably, the semiconductor substrate is selected from silicon structures and SOI structures including silicon films as the surface semiconductors. The semiconductor substrate or films may be of single crystalline structure (for example, by epitaxial growth), poly crystalline structure, or amorphous structure.

The conduction type of the semiconductor substrate may also be either P type or N type. Preferably, the semiconductor substrate includes at least one well region of the first conduction type (P type or N type). The semiconductor substrate or well region may accept a known concentration rate of impurities in the relevant technology. When the semiconductor substrate is of SOI structure, its surface semiconductor film may be provided with a well region as well as a body region beneath the channel region.

(7) The semiconductor memory device manufactured by the inventive method of each of the embodiments may be an assembly of element separating regions, transistors, capacitors, resistors, their wiring circuits, other semiconductor devices, and interfilm insulating films patterned on a single-film or multi-film semiconductor substrate or a semiconductor film. The element separating regions may be implemented with LOCOS films, trench oxide films, STI films, or any applicable films.

(8) The gate insulating films in the foregoing embodiments are of no limitations so long as being used commonly in a semiconductor device. For example, the gate insulating film may be selected from silicon oxide films, silicon nitride films, high dielectric single-film or multi-film structure such as aluminum oxide, titanium oxide, tantalum oxide, hafnium oxide. Preferably, the gate insulating film is in the form of a silicon oxide film. The thickness of the gate insulating film may be within in a range from 1 to 20 nm or preferably from 1 to 6 nm. The gate insulating film may be provided just below the gate electrode or arranged of a size greater (in the width) than that of the gate electrode.

(9) The gate electrode in the embodiments is made of, but not limited to, a common material used in a known semiconductor device. The material of the gate electrode may be selected from poly silicon, common metals including copper and aluminum, high fusing point metals including tungsten, titanium, and tantalum, and a combination of a high fusing point metal and silicide in a single-film or multi-film structure. The gate electrode may have a thickness of 50 to 400 nm.

Preferably, the gate electrode in the embodiments is provided at the inner side of each charge retention section (to confront the inner side of the same) and does not extend over the upper side of the charge retention section. This allows a contact plug to be positioned closer to the gate electrode, thus facilitating the down sizing of the memory device. As the memory device having the above arrangement is manufactured by simpler steps, its productivity will be increased.

(10) The channel region is provided in a lower region beneath the gate electrode in the active region (at one side of the gate insulating film opposite to the gate electrode) in each of the embodiments. Preferably, the channel region extends not only beneath the gate electrode but also outwardly off the lower ends at both sides, along the gate length direction, of the gate electrode (between two diffusion areas in the active region). When the channel region extends off the gate electrode, it may preferably be protected with the gate insulating film or the charge retention section.

(11) The charge retention sections in each of the embodiments are made of films or regions having at least the functions of retaining charges or accumulating and retaining charges or trapping charges. The functions may be implemented by silicon nitride, silicon, silicate glass containing impurities of phosphor or boron, silicon carbide, alumina, high dielectric material such as hafnium oxide, zirconium oxide, or tantalum oxide, zinc oxide, or any other applicable metal.

The charge retention sections may also be composed of an insulating film in single-film or multi-film structure which includes, e.g., a silicon nitride film, a conductive or semi-conductive film, or at least one or more conductive or semi-conductive dots. The silicon nitride film has a lot of charge trapping levels and can thus obtain high hysteresis characteristics. Also, as the silicon nitride film has a high degree of charge retention capability thus increasing the retention period and minimizing the leakage of charges derived from leak path, it can favorably be used for manufacturing an LSI device.

Since its charge retention sections are provided with the insulating films including the insulating film such as a silicon nitride film having a higher charge retention capability, the device will be improved in the operational reliability for memory actions. The silicon nitride film is an insulator where all charges in the whole of a silicon nitride film are not immediately lost even if some have been leaked out. When the device comprises an array of memory devices of which the charge retention sections remain separated by a minimum distance from each other, its charge retention sections can be protected from losing charges quickly upon accidentally contacting each other, as compared with the conventional charge retention sections made of electrical conductors. In addition, since the contact plug can be located closer to or even overlapping with the charge retention sections, the memory device will easily be minimized in the overall size. Moreover, as the charge retention sections is made of the insulating film which has a conductor or semiconductor provided therein, the injecting of a charge into the conductor or semiconductor can arbitrarily be controlled thus encouraging the multi-bit memorization of the memory device.

It is unnecessary that the insulator of the charge retention section for retaining charges is arranged of a film form. Preferably, the insulator having the charge retaining function is discretely provided in the insulating film for improving the reliability of data memory. More specifically, the material is provided in the form of dots in the insulator of a charge-retention difficult material such as silicon oxide. Since the charge retention sections are composed of insulating films which contain at least one conductor or semiconductor dot, their programming and erasing action can easily be conducted through direct tunneling of charges, hence improving the effect of energy saving.

In other words, the charge retention section includes preferably a film which has a region from which a charge is hardly escaped or a function of permitting a charge to escape with much difficulty. The function of permitting a charge to escape with difficulty may be implemented by a silicon oxide film or the like.

Throughout the embodiments, when the charge retention sections are composed of electrically conductive films, they have to be isolated by an insulator from the active regions (well regions, body regions, source/drain regions, or diffusion areas) or the gate electrode. More particularly, the charge retention sections may be arranged of, e.g., a film structure which comprises conductive films and insulating films or a structure where the conductor is provided in the form of dots in the insulating film or a structure located partially in the side wall insulating film provided on the side wall of the gate. The charge retention sections are located directly or via an insulating film at the both sides of the gate electrode or directly or via a gate insulating film or an insulating film on the active regions (well regions, body regions, source/drain regions, or diffusion areas). The charge retention sections provided at both sides of the gate electrode may be arranged to cover partially or entirely the side wall of the gate electrode directly or via an insulating film.

(12) The charge retention sections are not limited to those in the first embodiment where the second insulating film is implemented by the silicon nitride film 22 and the first and third insulating films are implemented by the silicon oxide films 21 and 23 respectively but may be arranged where the second insulating film is hafnium oxide, tantalum oxide, or yttrium oxide rather than silicon nitride (film). Similarly, the first and third insulating films may be implemented by aluminum oxide rather than silicon oxide (film). Also, the first insulating film and the third insulating film may be made of one material or two different materials respectively.

(13) Throughout the embodiments, the source/drain regions are provided as two different conduction type diffusion areas from a well region or a semiconductor substrate, each located at the side opposite to the gate electrode of the corresponding retention section. The interface between the source/drain region and the active region is preferably arranged where the concentration of impurities is sharply increased. This permits the generation of hot electrons or hot holes to be efficiently proceeded at a lower level of voltage and the action to be speeded up with a lower voltage.

The junction depth of the source/drain regions is not limitative but may be adjusted to any desired distance depending on, e.g., the performance of the semiconductor memory device. For example, when the semiconductor substrate is used of SOI structure, the source/drain region may have a junction depth smaller than the thickness of the semiconductor film at the surface of the substrate. Preferably, the junction depth of the source/drain region is substantially equal to the thickness of the semiconductor film at the surface.

The source/drain regions may be provided so as to (partially) overlap with both ends of the gate electrode or to be offset from (but not overlap with) the lowermost of the gate electrode. When the source/drain regions are offset from the gate electrode, their offset regions beneath the charge retention sections may be improved in the action of inversion which is triggered by a change in the charger saved in the charge retention sections when the gate electrode has been supplied with a voltage. As the result, the memory effect will be increased thus minimizing the short channel effect.

However, if the offset is too great, the flow of driving current between the source and the drain will sharply be declined. It is hence true that the offset which is a distance between the end of the gate electrode and the source/drain region along the gate length is preferably shorter than the thickness of the charge retention film which extends in parallel to a direction of the gate length. It is more essential that the charge retention regions of the charger retention section are at least partially overlapped with the source/drain regions in the diffusion areas. The reason is obvious that the exchange of a data saved in the memory device in the semiconductor memory device according to the present invention largely depends on the electric field which extends across the charge retention section as is determined by a voltage difference between the source/drain region and the gate electrode provided at the side wall of the charge retention section.

The source/drain regions may be provided at the surface of the channel region or higher than the lower side of the gate insulating film. In this case, a conductive film arranged integral with the source/drain regions is also provided on the source/drain region in the semiconductor substrate. The conductive film may be made of a material selected from semiconductors including poly silicon and amorphous silicon, silicide, the above described metals, and high fusing point metals. In particular, poly silicon is most preferably used. As poly silicon is higher in the speed of diffusion of impurities than the semiconductor substrate, the junction depth of the source/drain regions in the semiconductor substrate can easily be minimized thus attenuating the short channel effect. In the latter case, the charge retention regions are at least partially sandwiched between the source/drain regions and the gate electrode.

Figure 14:
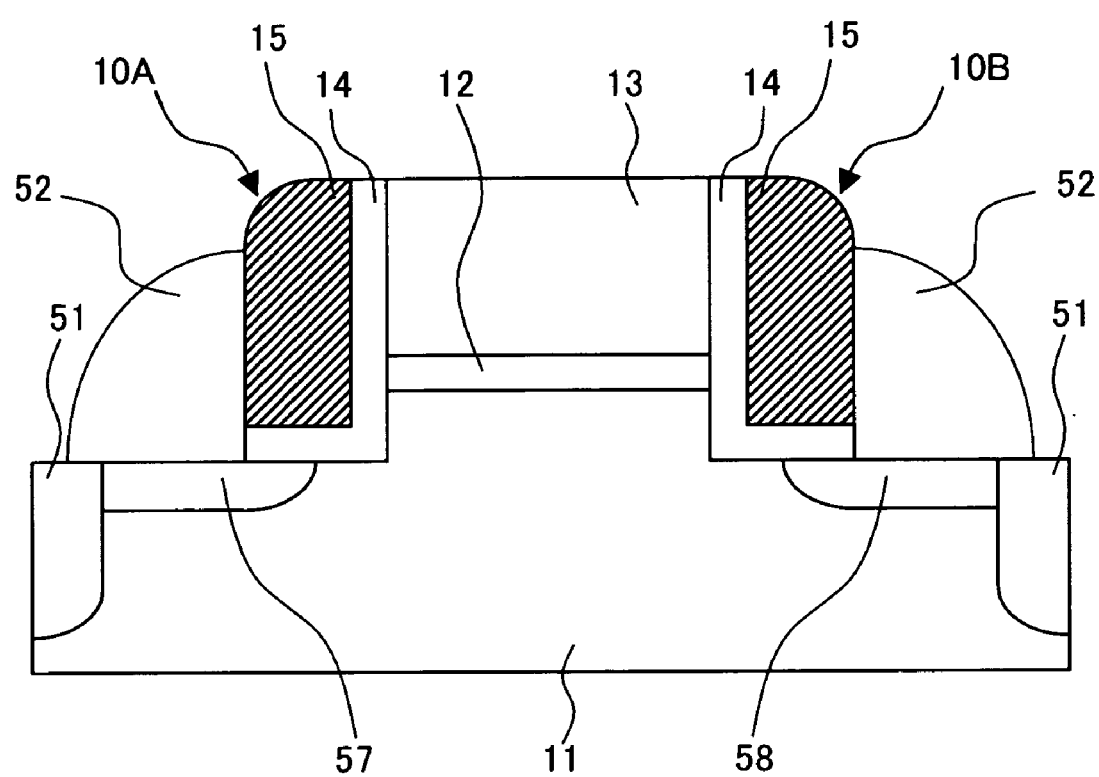
FIG. 14 is a schematic cross sectional view showing a further embodiment of a method of manufacturing a semiconductor memory device according to the present invention.
Figure 15:
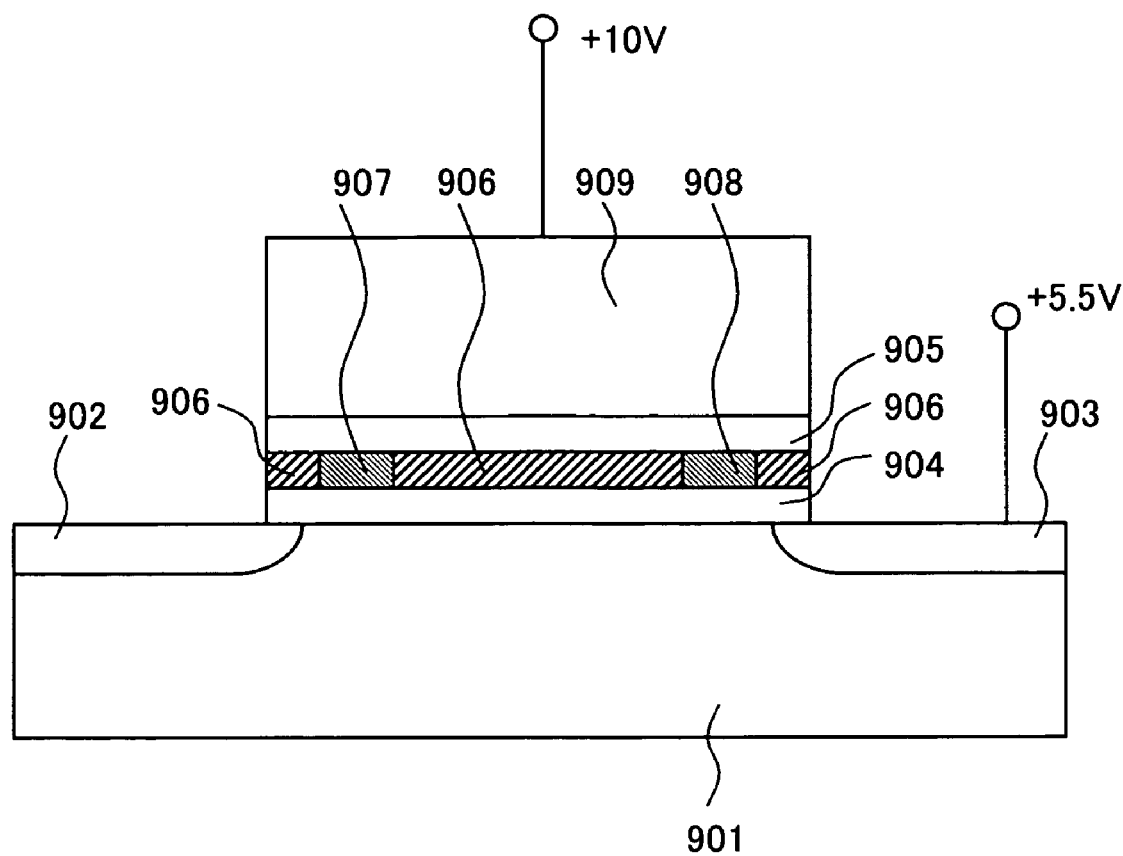
FIG. 15 is a schematic cross sectional view showing a primary part of a conventional semiconductor memory device.

FIG. 14 illustrates an example where the source/drain regions are partially located higher than the channel region surface. Electrically conductive side walls 52 of, e.g., poly silicon or amorphous silicon are provided at both sides of the charge retention sections 10A and 10B respectively. The side walls 52 are injected with impurities and then subjected to a heat treatment for diffusion of the impurities therethrough to develop the source/drain regions. Simultaneously, the impurities are diffused into the action regions 11 (to develop regions 57 and 58). The source region (or drain region) hence consists of the side wall 52 and the diffusion area 57 (or 58). Accordingly, the source/drain regions stay higher than the channel region surface. Denoted by 51 is the element separating region.

The above described arrangement allows the source/drain regions to be increased in the thickness as compared with the source/drain regions extend only the regions 57 and 58, thus lowering the resistance in the source/drain regions. Accordingly, the readout action on the memory device can be speeded up. Also, when the side walls 52 are made of, e.g., poly silicon or amorphous silicon, the speed of the impurities being diffused is significantly greater in the poly silicon or amorphous silicon than in the action region 11. This allows the regions 57 and 58 to be easily decreased in the thickness along the vertical to the sheet of paper (or the gate length or a direction at a right angle to the stack of the active region 11 and the gate insulating film 13) during the provision of the source/drain regions by heating up. Thus, it becomes easy to make the source/drain regions to be shallow junction. As the result, the memory device can be minimized in the overall size with much ease.

As set forth above, the semiconductor memory device manufactured by the inventive method can effectively be prevented from dielectric breakdown of its charge retention section which may result from non-uniform thickness of the film exposed to an itensity of the electric field during the memory re-programming action.

The semiconductor memory device manufactured by the inventive method is applicable to any battery-driven portable electronic apparatus mobile such as a mobile data terminal. The mobile electronic apparatuses include mobile data terminals, mobile telephones, and portable game machines.

The inventive method is not limited to the foregoing embodiments while numerous modifications may be made without departing from the scope of the present invention depicted in the appended claims. The technical teachings of the inventive method are intended to cover variations coming from any combination of the technical means disclosed in the embodiments.

Although the present invention has been described in terms of the preferred embodiments, it will be appreciated that various modifications and alterations might be made by those skilled in the art without departing from the spirit and scope of the invention. The invention should therefore be measured in terms of the claims which follow.

What is claimed is:

1. A method of manufacturing of a semiconductor memory device comprising:
    a first step of providing a gate insulating film on an active region of the first conduction type which is formed on a part of a semiconductor substrate surface;
    a second step of depositing a first conductive film on the gate insulating film;
    a third step of processing the first conductive film, the gate insulating film, and the active region to provide at least one opening of which the bottom is located below the interface between the active region and the gate insulating film and then providing a gate electrode surrounded by the opening or between the openings;
    a fourth step of depositing a first insulating film which covers the side and bottom surface of the opening;
    a fifth step of depositing a second insulating film over the first insulating film;
    a sixth step of shaping the first insulating film and the second insulating film into a side wall spacer shape by etching thus to provide charge retention sections onto the opening at both sides of the gate electrode; and
    a seventh step of providing diffusion areas of the second conduction type, which is different from the first conduction type, at opposite sides of the gate electrode beneath the charge retention sections in the active region.

2. The method of manufacturing of a semiconductor memory device according to claim 1, wherein
the third step includes arranging a side wall of the opening beneath the lower side of the gate insulating film to a tilted form which becomes further distanced from the gate electrode as being closer to the bottom of the opening.

3. The method of manufacturing of a semiconductor memory device according to claim 1, wherein
the third step includes a sub step of processing the first conductive film and the gate insulating film to provide the opening, a sub step of providing a fourth insulating film which covers the side and bottom surface of the opening, and a sub step of removing the fourth insulating film.

4. The method of manufacturing of a semiconductor memory device according to claim 3, wherein
the fourth insulating film is a silicon oxide film.

5. The method of manufacturing of a semiconductor memory device according to claim 1, wherein
a step of depositing a third insulating film on the second insulating film after the fifth step of depositing the second insulating film and the sixth step includes processing the first insulating film, the second insulating film, and the third insulating film to a side wall spacer form by etching.

6. The method of manufacturing of a semiconductor memory device according to claim 5, wherein
the third insulating film is a silicon oxide film.

7. The method of manufacturing of a semiconductor memory device according to claim 1, wherein
the first insulating film is a silicon oxide film.

8. The method of manufacturing of a semiconductor memory device according to claim 1, wherein
the second insulating film is a silicon nitride film.

* * * * *